US 6,621,250 B1

(12) United States Patent
Ohkubo et al.

(10) Patent No.: US 6,621,250 B1
(45) Date of Patent: Sep. 16, 2003

(54) BATTERY CAPACITY MEASURING AND REMAINING CAPACITY CALCULATING SYSTEM

(75) Inventors: Naohiko Ohkubo, Aichi-ken (JP); Shinji Kishida, Toyota (JP); Shinichi Ito, Toyota (JP); Toshiyuki Kawai, Nishio (JP); Katsuhide Kikuchi, Nishio (JP); Tetsuro Kikuchi, Nishio (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 14 days.

(21) Appl. No.: 10/070,375

(22) PCT Filed: Sep. 8, 2000

(86) PCT No.: PCT/JP00/06170

§ 371 (c)(1),
(2), (4) Date: Mar. 6, 2002

(87) PCT Pub. No.: WO01/18938

PCT Pub. Date: Mar. 15, 2001

(30) Foreign Application Priority Data

| Oct. 1, 1999 | (JP) | ............................................. 11-281751 |
| Sep. 13, 1999 | (JP) | ............................................. 11-259306 |
| Sep. 9, 1999 | (JP) | ............................................. 11-255632 |
| Feb. 28, 2000 | (JP) | ............................................. 2000-56056 |

(51) Int. Cl.$^7$ .......................... H02J 7/00; G10N 27/416
(52) U.S. Cl. ....................................... 320/136; 324/426
(58) Field of Search ................................ 320/132, 136, 320/134, 149; 324/426

(56) References Cited

FOREIGN PATENT DOCUMENTS

| JP | A 4-229030 | 8/1992 |
| JP | A 5-322998 | 12/1993 |
| JP | A 6-351166 | 12/1994 |
| JP | A 7-46772 | 2/1995 |
| JP | A 7-191108 A | 7/1995 |
| JP | A 10-288654 | 10/1998 |
| JP | A 10-319100 | 12/1998 |
| JP | 0 913 698 A1 | 5/1999 |
| JP | A 2000-123886 | 4/2000 |
| JP | A 2000-257461 | 9/2000 |

*Primary Examiner*—Gregory J. Toatley, Jr.
(74) *Attorney, Agent, or Firm*—Oliff & Berridge, PLC

(57) ABSTRACT

A battery capacity measuring device in accordance with the present invention has a fully-charged state detector (80e), a detected current integrator (80a), a divider (80b), and a corrector (80c) incorporated in a microcomputer (80). The fully-charged state detector detects that a battery is fully charged. The detected current integrator integrates current values that are detected by a current sensor during a period from the instant the battery is fully charged to the instant it is fully charged next. The divider divides the integrated value of detected current values by the length of the period. The corrector corrects a detected current using the quotient provided by the divider as an offset. Furthermore, a remaining battery capacity calculating system comprises a voltage detecting unit (50), a current detecting unit (40), an index calculating unit, a control unit, and a calculating unit. The voltage detecting unit detects the voltage at the terminals of a battery. The current detecting unit detects a current flowing through the battery. The index calculating unit calculates the index of polarization in the battery according to the detected current. The control unit controls the output voltage of an alternator so that the index of polarization will remain within a predetermined range which permits limitation of the effect of polarization on the charged state of the battery. When the index of polarization remains within the predetermined range, the calculating unit calculates the remaining capacity of the battery according to the terminal voltage of the battery, that is, the open-circuit voltage of the battery.

15 Claims, 28 Drawing Sheets

Fig.12

| CONDITION | P < Pb | Pb ≦ P ≦ Pa | Pa < P |
|---|---|---|---|
| SOC < SOC1 | f = 0<br>g = 1<br>h = 0 | f = 0<br>g = 1<br>h = 0 | f = 0<br>g = 1<br>h = 0 |
| SOC1 ≦ SOC<br>≦ SOC2 | f = 0<br>g = 1<br>h = 0 | f = 1<br>g = 1<br>h = 0 | f = 1<br>g = 1<br>h = 1 |
| SOC2 < SOC | f = 1<br>g = 1<br>h = 1 | f = 1<br>g = 1<br>h = 1 | f = 1<br>g = 0<br>h = 1 |

DISCHARGING ⟵ ⟶ CHARGING

DISCHARGING ⟵ ⟶ CHARGING

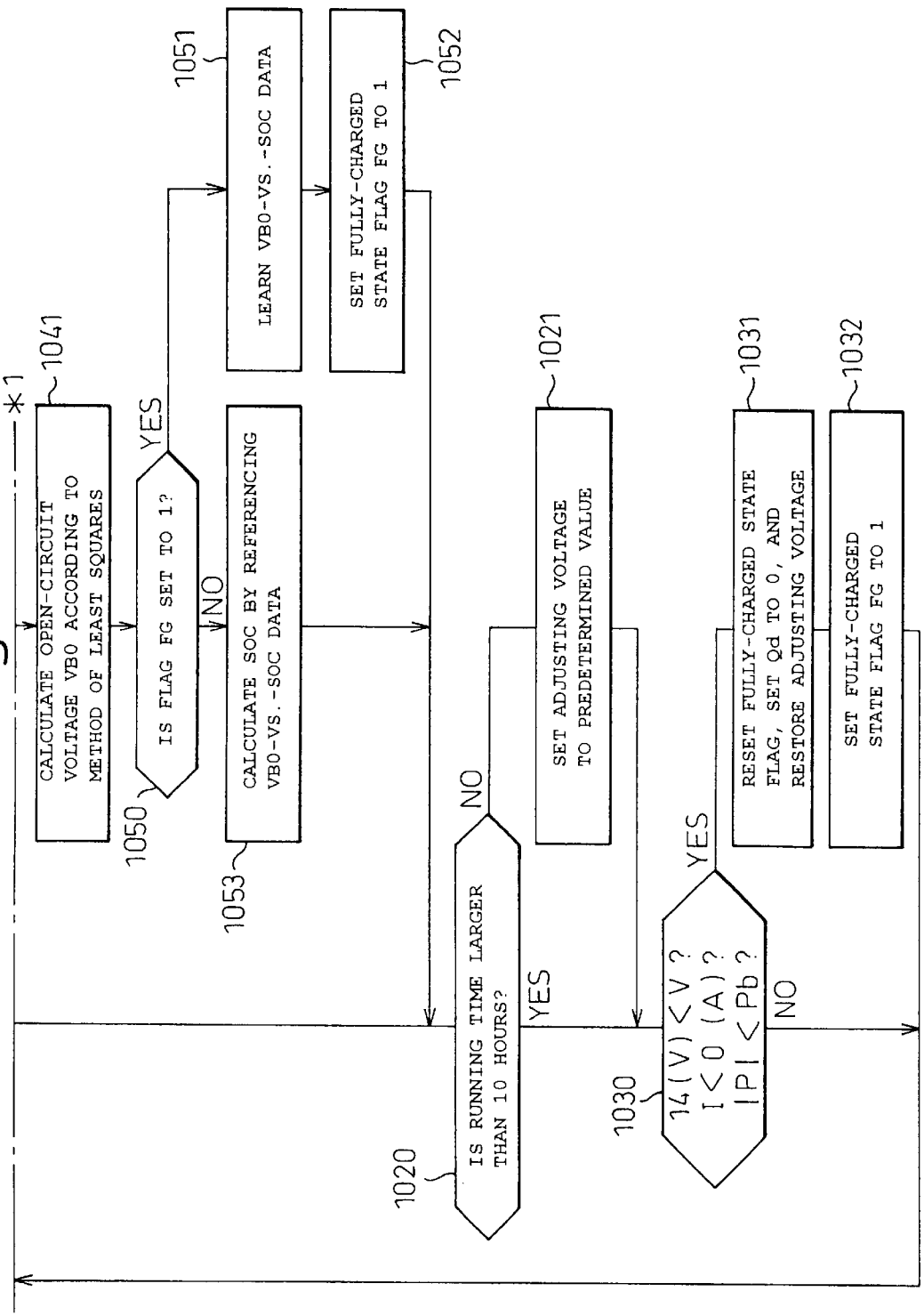

Fig.24
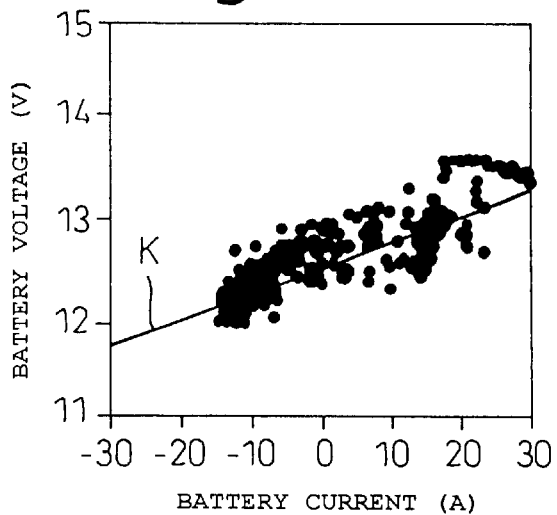
(a)
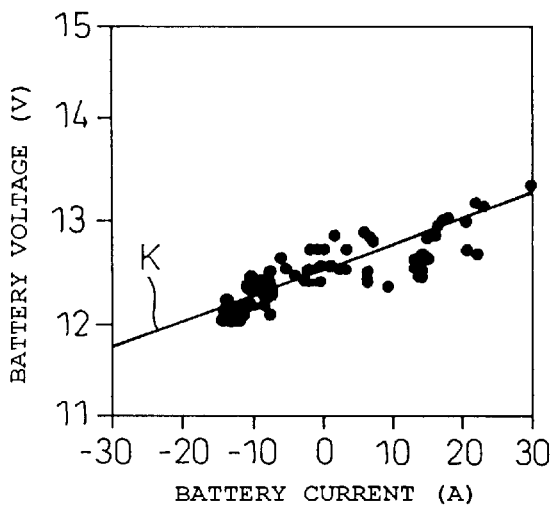
(b)
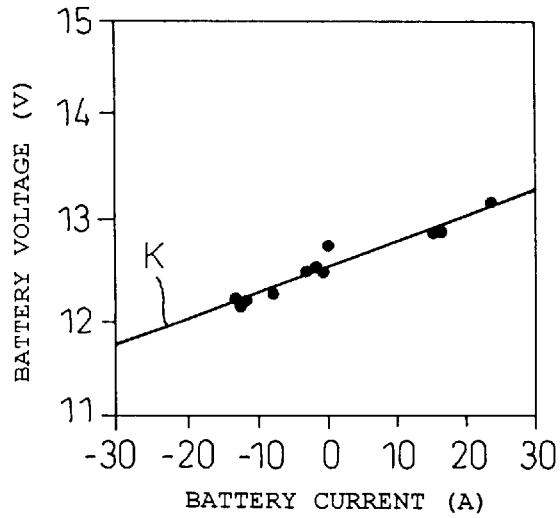
(c)

Fig.25
(a) BATTERY VOLTAGE
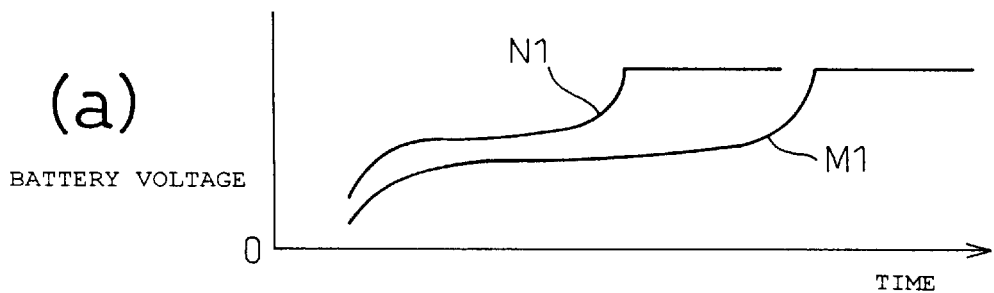
TIME
(b) BATTERY CURRENT
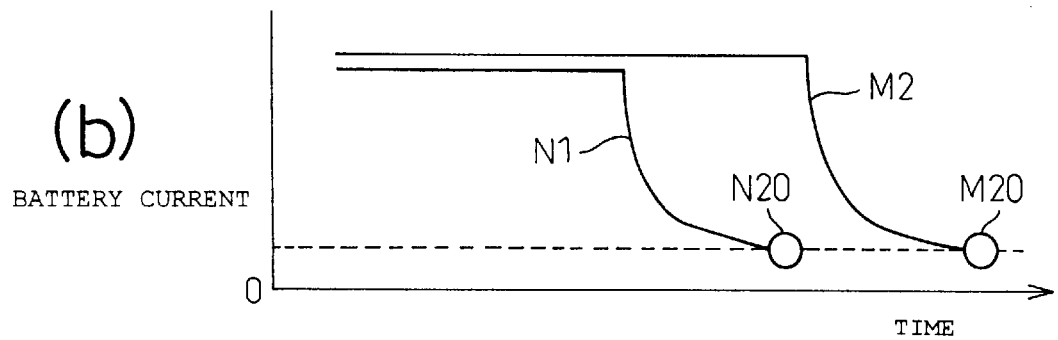
TIME

Fig.26
(a) 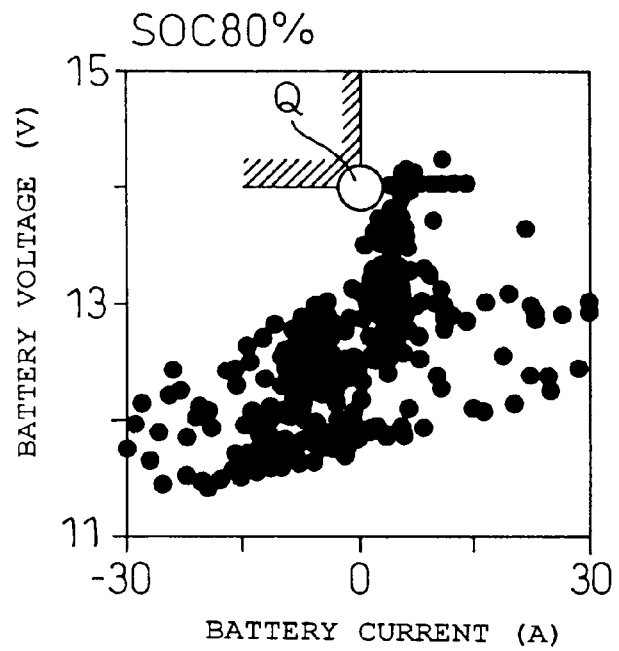
(b) 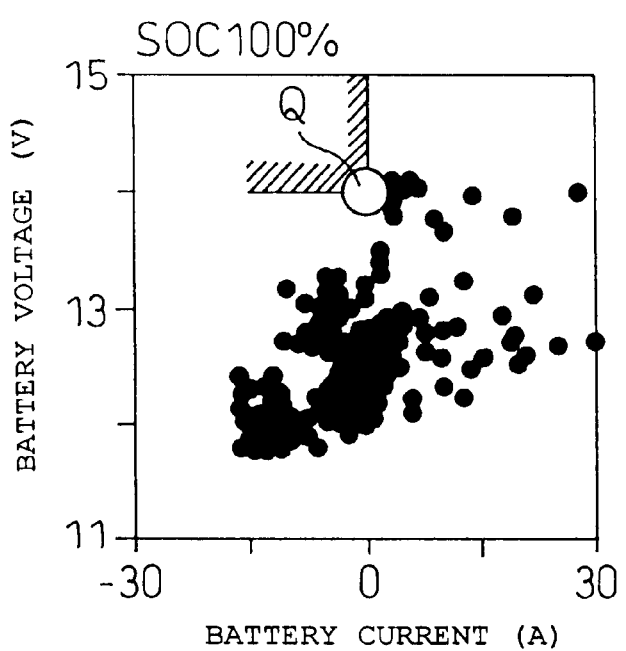

Fig.27
(a) 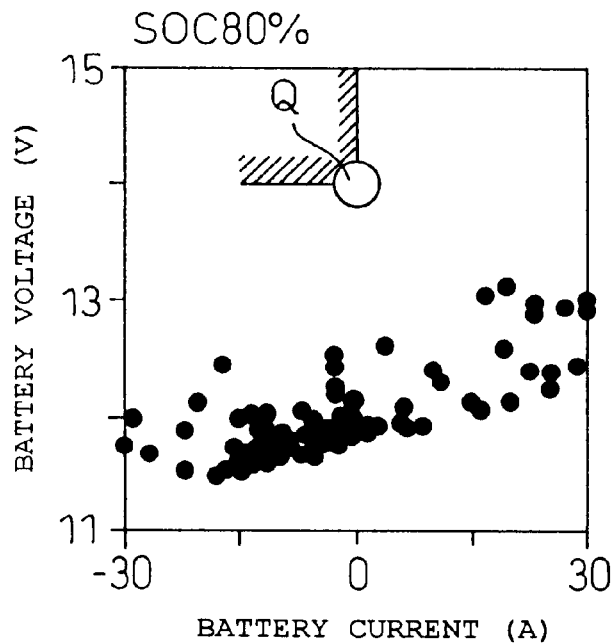
(b) 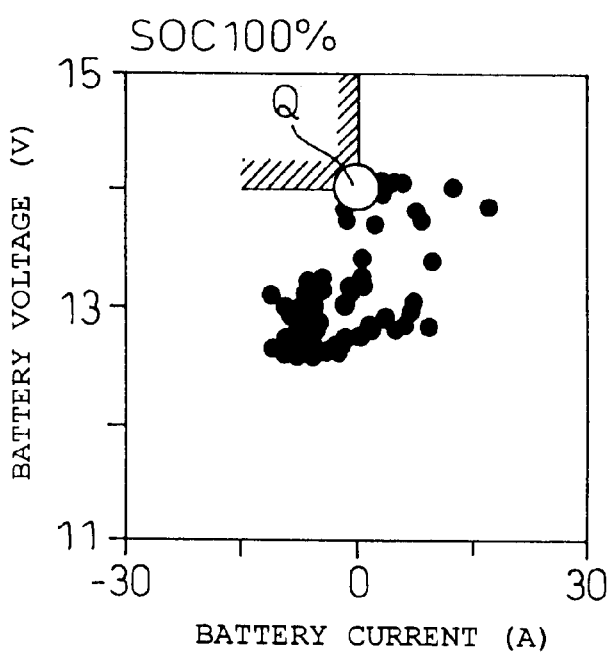

BATTERY CAPACITY MEASURING AND REMAINING CAPACITY CALCULATING SYSTEM

TECHNICAL FIELD

The present invention relates to a battery capacity measuring and remaining capacity calculating system. More particularly, the present invention is concerned with a battery capacity measuring device for vehicle batteries, a remaining capacity calculating system for vehicle batteries, an automatic engine stopping/starting system for vehicles based on a remaining battery capacity, an electrical rotating machine control system for vehicles based on remaining battery capacity, and a fully-charged state judging system for vehicle batteries.

BACKGROUND ART

Background Art Relating to the First Mode of the Present Invention

A battery mounted in a vehicle is used as a power supply that supplies power to a starter for an engine and other accessories. The battery is charged from time to time by means of a generator that operates with power exerted by an internal combustion engine. A battery capacity measuring device measures a current battery capacity, and the generator is controlled based on the detected battery capacity.

For example, Japanese Unexamined Patent Application Publication No. 6-351166 discloses a technology for maintaining a battery capacity, which matches power consumption required by a load, with low fuel consumption, and preventing deterioration of a battery caused by overcharging or over-discharging. Herein, when a battery is nearly fully charged, an adjusting voltage is lowered for fear the battery may be overcharged. Nevertheless, generation must be able to be achieved with low fuel consumption. In contrast, when the battery capacity is insufficient, the adjusting voltage is raised for fear the battery may be over-discharged. In this example, the battery capacity is calculated based on an integrated value of charging/discharge current values of the battery detected by a current sensor.

In case a battery capacity is calculated based on an integrated value of charging/discharge current values of the battery, the precision in detection performed by a current sensor has a significant meaning. In particular, if a detected current value contains an error that must be offset, the offset values are integrated in order to calculate a current battery capacity. This makes it hard to properly control charging of the battery. The offset error is detected by measuring a current that flows when a circuit is open. As far as a vehicle is concerned, even when an engine is stopped, power is fed to accessories including a clock. It is therefore hard to measure the current with the circuit fully open. A method has been proposed in efforts to cope with this problem, wherein a dark current flowing with the engine stopped is estimated in advance, and an offset error is calculated with the dark current removed.

However, the dark current flowing with the engine stopped varies depending on the use state of an accessory or the type thereof. The dark current flowing with the engine stopped cannot always be estimated correctly. Thus, there is a fear that an error in a detected charging/discharge current may get larger.

According to the first mode of the present invention, the present invention attempts to solve the above problem underlying related arts. An object of the present invention is to provide a battery capacity measuring device capable of measuring a battery capacity with high precision.

Background Art Relating to the Second Mode of the Present Invention

A remaining capacity calculating system for calculating a remaining capacity that represents the charged state of a vehicle battery is disclosed in, for example, Japanese Unexamined Patent Application Publication No. 10-319100. In this example, while a vehicle is running, a current flowing through a battery is measured in order to predict a change in the local concentration of electrolytic solution. The degree of polarization caused by the change in the concentration is then estimated. A remaining battery capacity is calculated using a representation of a voltage-current characteristic measured when the effect of polarization is limited.

However, the conventional remaining capacity calculating system cannot estimate the degree of polarization during, for example, running of a vehicle during which a battery is continuously charged. This poses a problem in that the remaining capacity of the battery cannot be calculated precisely when it is needed.

According to the second mode of the present invention, the present invention attempts to solve the foregoing problem underlying related arts. An object of the present invention is to provide a remaining capacity calculating system for vehicle batteries, an automatic engine stopping/starting system, and an electrical rotating machine control system. Herein, polarization occurring in a battery and adversely affecting the charged state of the battery that is a secondary battery is utilized effectively.

Background Art Relating to the Third Mode of the Present Invention

Fully-charged state judging systems for vehicle batteries include a system that monitors a rise in the voltage at the terminals of a battery (for example, a lead-acid battery) to judge whether a battery is fully charged. This device utilizes a phenomenon that as long as a battery is charged with a constant current, when the battery is nearly fully charged, the voltage at the terminals of the battery rises.

However, when a vehicle is running, polarization attributable to a change in a charging/discharge current or a change in the concentration of electrolytic solution, occurs in a battery. Moreover, an output voltage of an alternator is regulated by a regulator and provided as an adjusting voltage. Therefore, a rise in the voltage at the terminals of the battery is not always associated with the fact that the battery is fully charged. This poses a problem in that even when the voltage at the terminals of a battery is monitored, it may not be able to judge highly precisely whether the battery is fully charged.

According to the third mode of the present invention, the present invention attempts to solve the above problem underlying related arts. An object of the present invention is to provide a fully-charged state judging system for vehicle batteries and a remaining battery capacity calculating system employing the fully-charged state judging system. The fully-charged state judging system can highly precisely judge whether a battery is fully charged, irrespective of an adjusting voltage produced by a regulator or polarization occurring in a battery.

DISCLOSURE OF INVENTION

In the aspect of the present invention set forth in claim 1, a microcomputer (80) includes a fully-charged state judging means.(80*e*), a detected current integrating means (80*a*), a dividing means (80*b*), and a correcting means (80*c*). The fully-charged state judging means detects whether a battery is fully charged. The detected current integrating means integrates the current values that are detected by a current sensor during a period from the instant a battery is fully charged to the instant it is fully charged thereafter. The dividing means divides an integrated value of detected current values provided by the detected current integrating means by, the length of the period. The correcting means corrects a detected current with an offset using a quotient provided by the dividing means.

Owing to the above features, when a battery is fully charged, a battery capacity that shall be denoted by SOC (state of charge) is restored to 100% that is identical to a battery capacity attained when the battery is fully charged previously. During a period from the instant a battery is fully charged previously to the instant it is fully charged this time, the battery is discharged and charged by the same amount of current. Therefore, an integrated value calculated by integrating the current values that are detected during the period from the instant a battery is fully charged previously to the instant it is fully charged this time contains offset values that are caused by the current sensor. The integrated value of the detected current values is divided by the length of the, period that is an integration period. Thus, the offset is calculated irrespective of a use form of a battery, that is, for what load such as an engine starter a battery is used. Consequently, an accurate charging/discharge current can be determined. Eventually, the battery capacity can be measured highly precisely.

Moreover, in the aspect of the present invention set forth in claim 2, a fully charging means (80*d*) is included so that, when a predetermined time has elapsed since the instant a battery is previously fully charged, the fully charging means will control a generator to fully charge the battery. Owing to this features when the predetermined time has elapsed, the battery is fully charged. Consequently, the offset error can be checked at substantially regular intervals. Furthermore, the battery capacity can be measured highly precisely.

Moreover, in the aspect of the present invention set forth in claim 3, the remaining capacity calculating, system for vehicle batteries includes a voltage detecting means (50) a current detecting means (40), an index calculating means (320), a control means (340 to 351, and 430 to 351), and a calculating means (361). The voltage detecting means (50) detects the voltage at the terminals of a battery (B) that is mounted in a vehicle having an electrical rotating machine (10, 10A) connected to an engine (E), and that is charged by the electrical rotating machine. The current detecting means (40) detects a current flowing through the battery. The index calculating means (320) calculates an index of polarization occurring in the battery according to the detected current. The control means controls the output voltage of the electrical rotating machine so that the index of polarization will remain within a predetermined range which permits limitation of the effect of polarization on the charged state of the battery. When the index of polarization remains within the predetermined range, the calculating means calculates the remaining capacity of the battery using the detected terminal voltage of the battery, that is, the open circuit voltage of the battery.

Owing to the above features, the control means controls the electrical rotating machine so that the index of polarization will remain within the predetermined range permitting limitation of the effect of the polarization on the charged state of the battery. At this time, the remaining capacity of the battery is calculated based on the detected terminal voltage of the battery, that is the open-circuit voltage of the battery. In short, the electrical rotating machine is actively controlled in order to cancel a change in the index of polarization so that the index will fall within the predetermined range. The remaining capacity SOC is calculated based on the open-circuit voltage at the terminals of the battery. Consequently, the calculation of the remaining capacity based on the open-circuit voltage of the battery can be performed timely and precisely, if necessary.

In the fourth aspect of the present invention set forth in claim 4, an automatic engine stopping/starting system for vehicles includes the remaining battery capacity calculating system set forth in claim 3, and an inhibiting means (230) that inhibits automatic stoppage of an engine when the remaining battery capacity falls below a permissible value.

Owing to the above features, automatic stoppage of an engine is inhibited based on a remaining capacity calculated by the remaining capacity calculating system. Consequently, automatic stoppage of the engine can be inhibited precisely. Thereafter, when an automobile is started, engine stall can be reliably prevented.

Moreover, in the aspect of the present invention set forth in claim 5, an electrical rotating machine control system for vehicles includes the remaining capacity calculating system for vehicle batteries set forth in claim 3, and a control means (431). Assuming that the electrical rotating machine is a motor-generator (MG), the control means controls the motor-generator so that the motor-generator will assist the engine when the remaining capacity is equal to or larger than a permissible value.

Owing to the above features, the control means can precisely control the electrical rotating machine according to the remaining capacity calculated by the remaining capacity calculating system so that the electrical rotating machine will assist the engine. Consequently, the battery satisfactorily maintains the property of receiving a charging current. Eventually, the battery can be charged timely and efficiently. This results in efficient collection of energy.

Moreover, in the aspect of the present invention set forth in claim 6, an electrical rotating machine control system for vehicles includes a voltage detecting means (50), a current detecting means (40), an index calculating means (320), and control means (340 to 351 or 430 to 451). The voltage-detecting means detects the voltage at the terminals of a battery (B) that is mounted in a vehicle having an electrical rotating machine (10 or 10A) connected to an engine E and that is charged by of the electrical rotating machine. The current detecting means detects a current flowing through the battery. The index calculating means calculates an index of polarization in the battery according to the detected current. The control means controls the electrical rotating machine so that the index of polarization will remain within a predetermined range permitting limitation of the effect of polarization on the charged state of the battery.

Owing to the above features, when the index of polarization remains within the predetermined range, the control means precisely controls the electrical rotating machine so that the electrical rotating machine will assist the engine. Consequently, the battery can maintain its property of receiving a charging current. The battery can be charged timely and efficiently. This, results in efficient collection of energy.

Moreover, in the aspect of the present invention set forth in claim 7, a fully-charged state judging system for vehicle batteries includes a voltage detecting means (50), a current detecting means (40), and a fully-charged state judging means (610, 620, 630, and 1030). The voltage detecting means detects the voltage at the terminals of a battery (B) that is mounted in a vehicle having an alternator (10) and a regulator (30) for regulating the output voltage of the alternator, and that is charged with the output voltage of the alternator (10) regulated by the regulator (30). The current detecting means detects a current flowing through the battery. When the detected terminal voltage and the detected current belong to a predetermined fully-charged state judgment domain, the fully-charged state judging means judges that the battery is fully charged. A fully-charged state judging system further includes an index calculating means (810, 1003) for calculating index of polarization in the battery according to the detected current belong to a predetermined fully-charged state judgment domain, the fully-charged state judging means judges that the battery is fully charged.

Owing to the above features, the fully-charged state judging means judges whether the battery is fully charged by checking if the index of polarization falls within a predetermined range of index values when the detected terminal voltage and the detected current are in the predetermined fully-charged state judgment range, it is judged that the battery is fully charged. The fully-charged state of the battery can be precisely judged compared with it is judged based on the voltage at the terminals of the battery.

In the aspect of the present invention set forth in claim 8, the predetermined fully-charged state judgment range employed in the fully-charged state judging system for vehicle batteries set forth in claim 7 is a range specified with voltage values higher than the rated voltage of the battery with the battery charged 90% or more and with current values assumed by a zero current flowing through the battery or a discharge current of the battery. Consequently, the advantage of the aspect of the present invention set forth in claim 7 can be attained more reliably.

In the aspect of the present invention set forth in claim 10, the predetermined range of index values set in the fully-charged state judging system for vehicle batteries set forth in claim 8 is a range of index values permitting negligence of a change in the concentration of electrolytic solution in the battery. Owing of the feature, the advantage of the aspect of the present invention set forth in claim 8 can be attained more reliably.

In the aspect of the present invention set forth in claim 11, a fully-charged state judging system for vehicle batteries includes a voltage detecting means (50), a current detecting means (40), an index 10 calculating means. (710 and 1003), and a fully-charged state judging means (720, 730, 740, and 1030). The voltage detecting means detects the voltage at the terminals of a battery (B) that is mounted in a vehicle having an alternator (10) and a regulator (30) for regulating the output voltage of the alternator, and that is charged with the output voltage of the alternator regulated by the regulator. The current detecting means (40), detects a current flowing through the battery. The index calculating means calculates an index of polarization caused by the electrolytic solution in the battery. When the detected terminal voltage belongs to a predetermined fully-charged state judgment range and the index of polarization falls within a predetermined range of index values, the fully-charged state judging means judges that the battery is fully charged.

Owing to the above features, when the detected terminal voltage belongs to the predetermined fully-charged state judgment range and the index of polarization falls within the predetermined range of index values, the battery is judged to be fully charged. Consequently, the fully-charged state of the battery can be highly precisely judged compared with when it is judged based on the voltage at the terminals of the battery.

In the aspect of the present invention set forth in claim 12, the predetermined fully-charged state judgment range set in the fully-charged state judging system for vehicle batteries set forth in claim 11 is a range specified with voltage values higher than the rated voltage for the battery with the battery charged 90% or more. The predetermined range of index values is a range of index values permitting negligence of a change in the concentration of electrolytic solution in the battery. Owing to the feature, the advantage of the aspect of the invention set forth in claim 11 can be attained more reliably.

In the aspect of the present invention set forth in claim 13, the fully-charged state judging system for vehicle batteries set forth in any of claim 7, claim 8, or claims 10 to 12 includes a regulator control means (971 to 982). The regulator control means controls the regulator repeatedly at regular intervals so that an adjusting voltage to be produced by the regulator will be set to a predetermined value higher than a normal adjusting voltage value. The fully-charged state judging means make the judgment when the adjusting voltage to be produced by the regulator is set to the predetermined value.

Owing to the above feature, when the adjusting voltage to be produced by the regulator is set to the normal adjusting voltage value, the advantage of the aspect of the present invention can be provided, while the judgment on whether the battery is fully-charged will not be adversely affected.

In the aspect of the present invention set forth in claim 14, the remaining capacity calculating system for vehicle batteries includes a fully-charged state judging system for A vehicle batteries set forth in any of claim 7, claim 8, or claims 10 to 13 and a remaining capacity calculating means (520). The remaining capacity calculating means calculates the remaining capacity of the battery when the fully-charged state judging system judges that the as battery is fully-charged. Owing to these features, the remaining capacity of the battery can be calculated highly precisely.

In the aspect of the present invention set forth in claim 15, the remaining capacity calculating system for vehicle batteries includes the fully-charged state judging system for vehicle batteries set forth in claim 8 or 11, an index judging means (1010), a learning means (1051), and a remaining capacity calculating means (1053). After the fully-charged state judging means included in the fully-charged state judging system judges that the battery is fully charged, the index judging means judges whether the index of polarization falls within a range of index values permitting stabilization of the open-circuit voltage of a battery. When the index judging means judges that the index of polarization falls within the range of index values permitting stabilization of the open-circuit voltage of a battery, the learning means learns the relationship between the remaining capacity and the open-circuit voltage established based on the degree of deterioration of the battery. The remaining capacity calculating means calculates the remaining capacity of the battery by referencing the result of learning performed by the learning means using the open-circuit voltage of battery.

Owing to the above features, the open-circuit voltage of the battery is used to calculate the remaining capacity. The remaining capacity can therefore be calculated quickly. Moreover, after the fully-charged state judging means included in the fully-charged state judging system judges that the battery is fully-charged, when it is judged that the index of polarization falls within the range of index vales permitting stabilization of the open-circuit voltage of the battery, the relationship between the remaining capacity and open-circuit voltage established based on the degree of deterioration of the battery is learned. The remaining capacity is calculated by referencing the result of the learning using the open-circuit voltage of the battery. Consequently, the remaining capacity can be calculated highly precisely, irrespective of the deterioration of the battery.

In the aspect of the present invention set forth in claim 15, the learning means included in the remaining capacity calculating system for vehicle batteries set forth in claim 15 learns the relationship between the remaining capacity and open-circuit voltage by referencing the relationship between the remaining capacity and open-circuit voltage established in the initial stage of the battery after it is judged that the battery is fully charged. At this time, the learning means takes account of an amount of discharge current of the battery released until the index judging means judges that the index of polarization falls within the range of index values permitting stabilization of the open-circuit voltage of the battery after it is judged that the battery is fully charged. Owing to this feature, the advantage of the aspect of the present invention set forth in claim 15 can be further improved.

Incidentally, the numerals in parentheses denote a exemplary means that will be described in relation to embodiments later and that realize the aforesaid features.

BRIEF DESCRIPTION OF THE DRAWINGS

FIG. 12 is an explanatory diagram showing a map representing the relationship between an index P of polarization and a remaining capacity SOC employed in Embodiment 2 shown in FIG. 8;

FIG. 22A and FIG. 22B are flowcharts describing the operation of a microcomputer employed in Embodiment e, in which the third mode of the present invention is implemented;

FIG. 24$a$ is a graph indicating the relationship between a battery voltage and a battery current established in Embodiment e, irrespective of an index P;

FIG. 24$b$ is a graph indicating the relationship between a battery voltage and a battery current established relative to an index P ($|P|<1000$);

FIG. 24$c$ is a graph indicating the, relationship between a battery voltage and a battery current established relative to an index P ($|P|<100$);

FIG. 25$a$ is a graph indicating a time-sequential change in a battery voltage occurring in Embodiment e, when a battery is new or has deteriorated;:

FIG. 25$b$ is a graph indicating a time-sequential change in a battery current occurring in Embodiment e when a battery is new or has deteriorated;

FIG. 26$a$ is a graph indicating the relationship between a battery voltage and a battery current established in Embodiment e with a remaining capacity SOC=80% during running of a vehicle concerned;

FIG. 26$b$ is a graph indicating the relationship between a battery voltage and a battery current established in Embodiment e with a remaining capacity SOC=100% during running of the vehicle;

FIG. 27$a$ is a graph indicating the relationship between a battery voltage and a battery current established in Embodiment e with a remaining capacity SOC=80% and an index P=2000;

FIG. 27$b$ is a graph indicating the relationship between a battery voltage and a battery current established in Embodiment e with a remaining capacity SOC=100% and an index P=2000.

BEST MODE FOR CARRYING OUT THE INVENTION

Embodiment in which the First Mode of the Present Invention is Implemented

Figure 1:
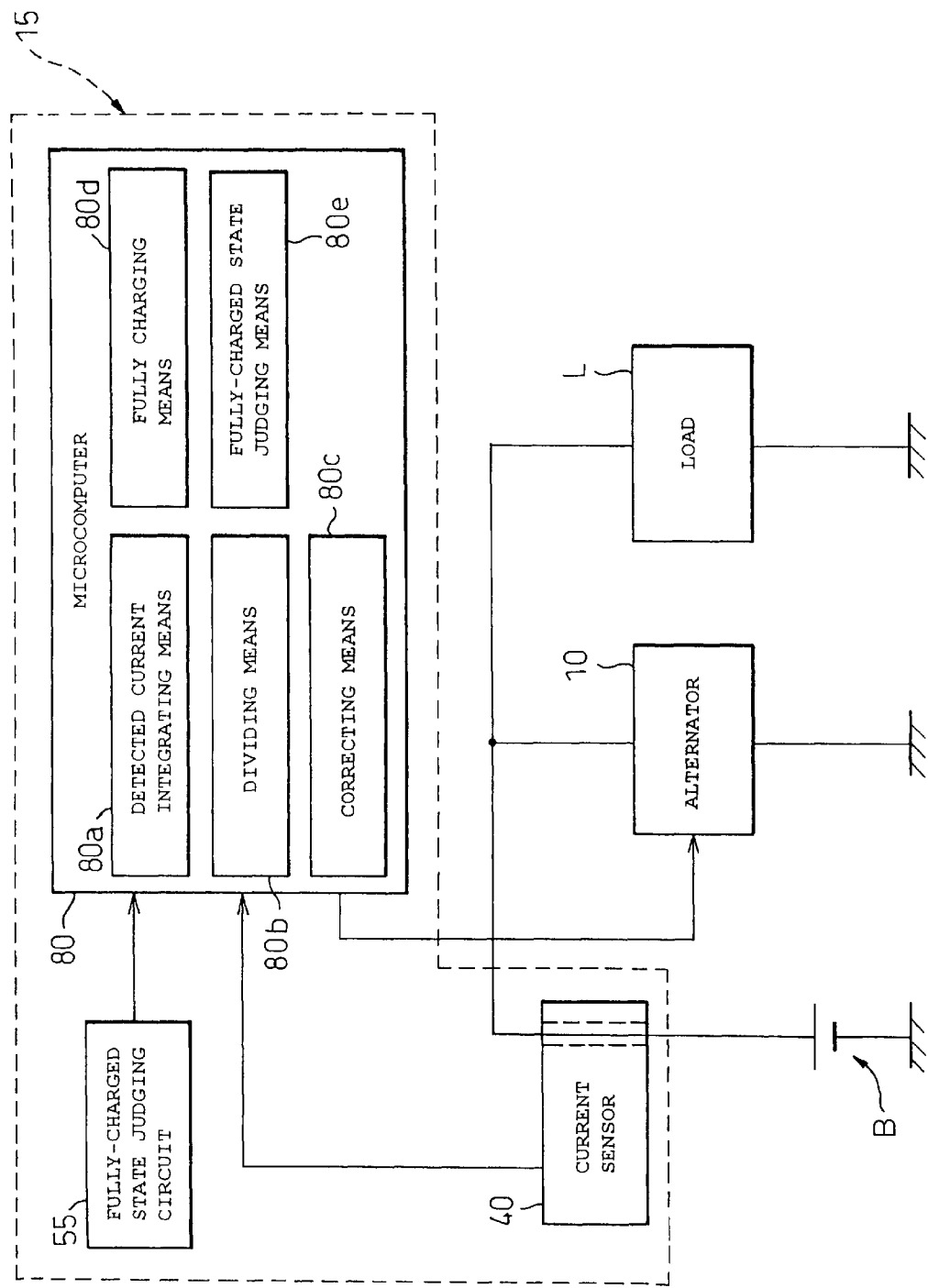
FIG. 1 is a block diagram of a battery capacity measuring device attached to a battery in which the first mode of the present invention is implemented.

FIG. 1 shows the configuration of a battery capacity measuring device in accordance with the present invention. An alternator 10 is connected to a battery B to which the battery capacity measuring device 15 of the present invention is attached. The battery B is rechargeable by the alternator 10. The alternator 10 is actuated with power exerted by an engine that is not shown. An engine starter or any other load L is connected to the battery B. The battery capacity measuring device 15 has a current sensor 40, which monitors a charging current or a discharge current of the battery B, connected at the middle of a cable routed from the battery B to the alternator 10 and the load L.

A microcomputer 80 receives as an input a signal detected by the current sensor 40. Based on a charging/discharge current of the battery B detected by the current sensor 40, the microcomputer 80 calculates the present capacity of the battery B. The microcomputer 80 is realized with a typical microcomputer having a CPU and a memory (RAM or ROM).

The microcomputer 80 also fills the role of a controller for controlling the alternator 10, and issues a command, which represents an adjusting voltage value, to the alternator 10 so as to adjust an exciting current. The microcomputer 80 thus controls an amount of ac power to be generated by the alternator 10. The microcomputer 80 includes a detected current integrating means 80a, a dividing means 80b, a correcting means 80c, and a fully-charged state judging means 80e which are run on the CPU of the microcomputer. A charging/discharge current of the battery B is inferred from a current detected by the current sensor 40. Moreover, the microcomputer 80 includes a fully charging means 80d that is run on the CPU thereof. When predetermined conditions are met, the adjusting voltage is raised in order to increase the amount of ac power to be generated. Thus, the battery B is fully charged.

Moreover, the battery capacity measuring device includes a fully-charged state judging circuit 55. When the battery B is fully charged, the fully-charged state judging circuit 55 transmits a judgment signal, which indicates that the battery is fully charged, to the microcomputer 80. The fully-charged state judging means 80e informs the microcomputer 80 of the fact of whether the battery B is fully charged. Various known technologies can be implemented in the fully-charged state judging circuit 55 and fully-charged state judging means 80e. In other words, the fully-charged state judging circuit 55 and fully-charged state judging means 80e may be designed to detect the voltage at the terminals of the battery B. In this case, when the terminal voltage rises greatly, it is judged that the battery is fully charged. Otherwise, assuming that a battery employed is a NiH battery or the like, the fully-charged, state judging circuit 55 and fully-charged state judging means 80e may be designed to detect the temperature, for example, the superficial temperature of the battery. In this case, when the temperature rises, it is judged that the battery is fully charged. Otherwise, the fully-charged state judging circuit 55 and fully-charged state judging means 80e may be designed to detect, the frequency by which feeding of the exciting current to the alternator 10 is enabled or disabled. In this case, when the frequency increases, it is judged that the battery is fully charged.

Figure 2:
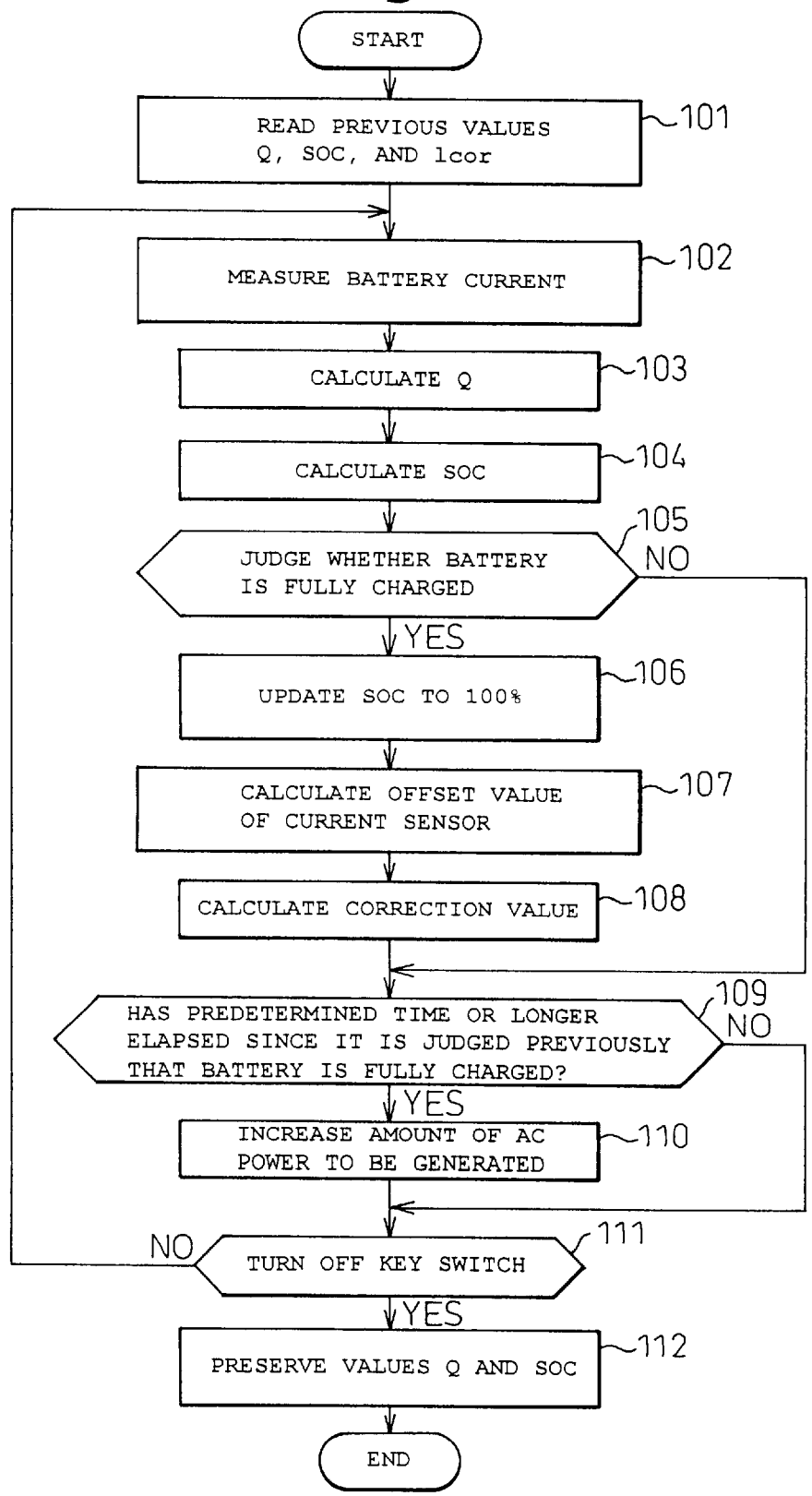
FIG. 2 is a flowchart describing a control sequence followed by a microcomputer incorporated in the battery capacity measuring device shown in FIG. 1.

FIG. 2 is a flowchart describing a control sequence to be executed by the microcomputer 80. The control sequence is initiated when a key switch is turned on and an engine is started. At step 101, an integrated value Q of detected current values and a remaining capacity SOC that are stored in the memory in the microcomputer 80 at the end of the previous control sequence are read. Moreover, a correction value $I_{cor}$ is read.

Step 102 is a step at which the correcting means 80c acts. A current $I_{meas}$ detected by the current sensor 40 is read, and a charging/discharge current I of the battery is calculated according to an expression (1) to be described later. As apparent from the expression (1), the charging/discharge current I of the battery is obtained by correcting the detected current. $I_{meas}$ using the correction value $I_{cor}$ as an offset The correction value $I_{cor}$ is calculated and updated at step 108, that will be described later.

$$I = I_{meas} - I_{cor} \quad (1)$$

The subsequent step 103 is a step at which the detected current integrating means 80a acts. The detected current integrating means 80a calculates an integrated value, Q of detected current values $I_{meas}$ according to an expression (2), that will be presented later. In the expression (2), $Q_0$ denotes a value the integrated value Q assumes before this step is executed, and t denotes an interval between measurements. Moreover, Q is initialized to 0 when the battery is fully charged previously (see step 107 that will be described later).

$$Q = Q_0 + I_{meas} \cdot t \quad (2)$$

At step 104, the remaining capacity SOC is calculated according to an expression (3), that will be presented later. In the expression (3), SCO0 denotes a value the remaining capacity SOC assumes before this step is executed, and C denotes the capacity of the battery B observed when the battery is fully charged or when SOC equals 100%. The remaining capacity SOC is used to control the alternator 10 as it conventionally is.

$$SOC = SCO0 + I \cdot t \cdot 100 / C \quad (3)$$

At step 105, it is judged whether the battery B is fully charged. This judgment is made based on a judgment signal sent from the fully-charged state judging circuit 55.

If the battery is not fully charged, steps 106, 107, and 108, that will be described later, are skipped and control is passed to step 109. It is judged from a count value indicated by a timer incorporated in the microcomputer 80 whether a predetermined time or more has elapsed since it is previously judged that the battery is fully charged.

If the predetermined time or more has not elapsed since it is previously judged that the battery is fully charged, step 110, that will be described later, is skipped and control is passed to step 111. It is then judged whether the key switch is turned off.

If the key switch SW is turned on, control is returned to step 102. Namely, steps 102 to 104 are repeated until it is judged that the battery is fully charged with the engine in operation. Consequently, the integrated value Q of detected current values and the remaining capacity SOC are updated.

When the key switch is turned off, control is passed from step 111 to step 112. The integrated value Q of detected current values and the remaining capacity SOC are stored in the memory in preparation for next initiation of the control sequence.

Moreover, when the engine is stopped, the microcomputer 80 acts in a sleep mode at regular intervals of a time whose passage is indicated by a timer. The microcomputer 80 may be activated periodically in order to execute the same procedure as the procedure composed of steps 101 to 104 and step 112 to calculate the integrated value Q of detected current values and the remaining capacity SOC.

When the predetermined time or more has elapsed since it is previously judged that the battery is fully charged, control is passed from step 109 to step 110. Step 110 is a step at which the fully charging means 80d acts. The adjusting voltage is raised and an amount of ac power to be generated by the alternator 10 is thus increased to a predetermined amount. Consequently, the battery B is fully charged. Step 105 is succeeded by steps 106, 107, and 108.

At step 106, the remaining capacity SOC is updated to an initial value of 100%. This is because the battery is fully charged.

The subsequent step 107 is a step at which the dividing means 80b acts. A time T that has elapsed since it is previously judged that the battery is fully charged and whose passage is indicated by the timer is read. An error $I_{offset}$ that is caused by the current sensor 40 and must be offset is calculated according to an expression (4), to be presented later. The integrated value Q is updated to an initial value of 0 after the offset $I_{offset}$ that must be offset is calculated.

$$I_{offset} = Q/T \quad (4)$$

At step 108, the correction value $I_{cor}$ is updated to the offset $I_{offset}$ according to an expression (5) below.

$$I_{cor} = I_{offset} \quad (5)$$

Incidentally, when the battery B is fully charged, the adjusting voltage is made equal to or slightly lower than the electromotive force of the battery B. The remaining capacity SOC is thus retained at a predetermined level.

Next, a description will be made of the advantage of the above control sequence according to which the current $I_{meas}$ detected by the current sensor is corrected using the offset $I_{offset}$ in order to calculate the charging/discharge current I of the battery.

Figure 3:
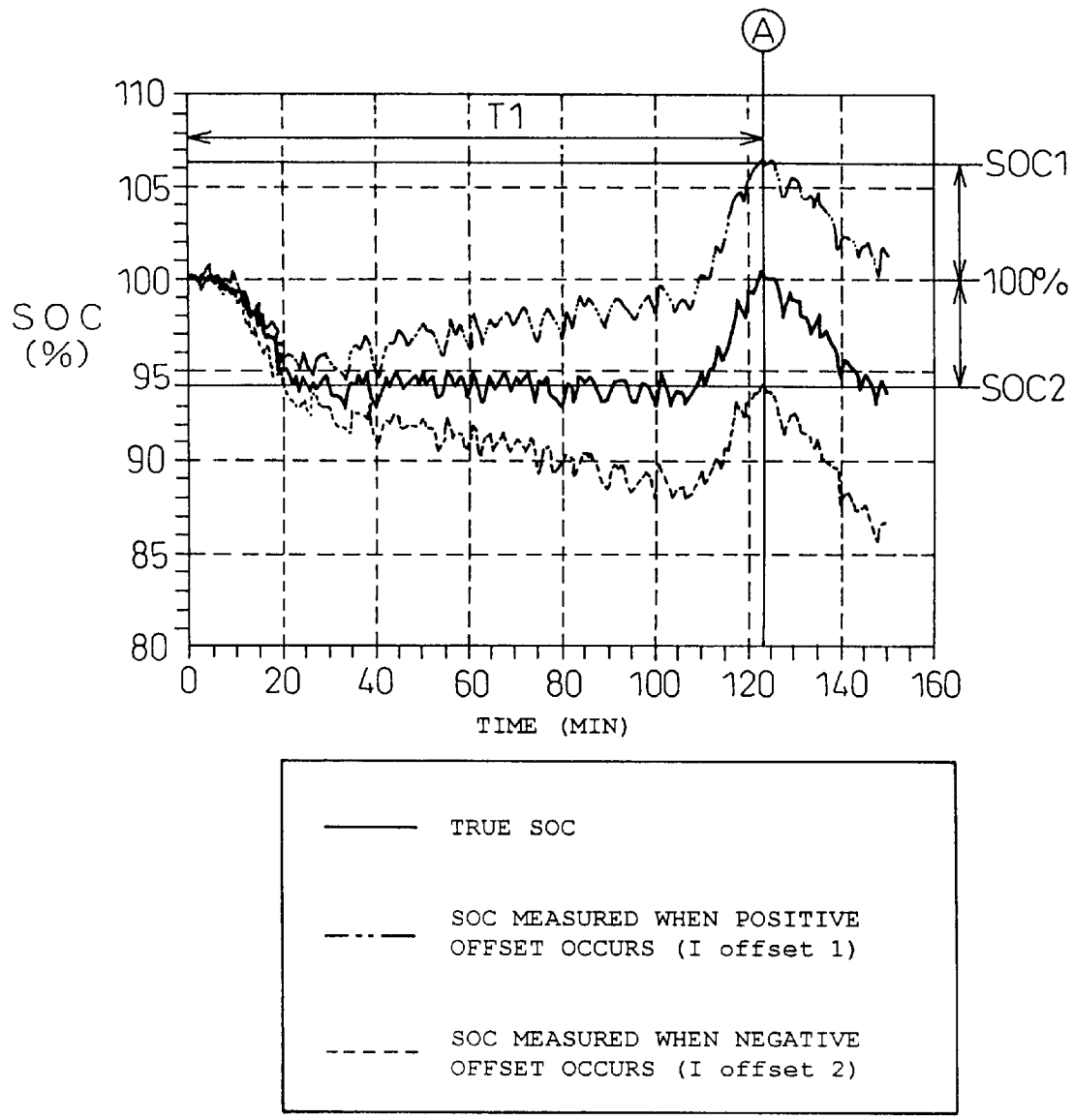
FIG. 3 is a graph for explaining the actions of the battery capacity measuring device shown in FIG. 1.

FIG. 3 graphically shows a time-sequential change in the remaining capacity SOC calculated by a conventional device that adopts a current detected by a current sensor as a charging/discharge current of a battery as it is without correcting it. The calculated value of the remaining capacity SOC changes from the initial value of 100%, depending on the integrated value of current values detected by:the current sensor 40.

Referring to FIG. 3, point A denotes a time instant at which the battery is charged to enter a fully-charged state. Herein, the battery B is discharged and charged by the same amount of energy during a period from the instant the battery is previously fully charged to the instant it is fully charged this time. At point A, the battery is restored to the same state as the previous fully-charged state. If the current sensor 40 indicates a true value of a charging/discharge current, the remaining capacity is reset to 100%, as indicated with a solid line in FIG. 3.

However, if the current sensor 40 causes a positive offset $I_{offset}$ that must be offset, the calculated value of the remaining capacity SOC deviates positively, as indicated with a dot-dash line in FIG. 3 (SOC1). This is because when detected current values are integrated, offset values are also integrated. The deviation is provided as a ratio of the integrated value of the offset values $I_{offset}$, which are detected during the period from the instant the battery is previously fully charged to the instant it is fully charged this time (point A), to the capacity C of the battery, and therefore expressed as follows:

$$SOC1-100(\%) = T1 \cdot I_{offset1}/C \cdot 100(\%) \quad (6)$$

If the current sensor 40 produces a negative offset $I_{offset}$ that must be offset, the calculated value of the remaining capacity SOC deviates negatively, as indicated with a dashed line in FIG. 3 (SOC2). This is because when detected current values are integrated, error values are also integrated. The deviation is provided as a ratio of the integrated value of the offset values $I_{offset}$, which are detected during the time interval T1 from the instant the battery is previously fully charged to the instant it is fully charged this time (point A), to the capacity C of the battery, and expressed as follows:

$$SOC2-100(\%) = T1 \cdot I_{offset2}/C \cdot 100(\%) \quad (7)$$

As mentioned above, the battery is discharged and charged by the same amount of energy during the period from the instant the battery is previously fully charged to the instant it is fully charged this time, and therefore restored to the same state as the previous fully-charged state. This means that actual discharge current values and actual charging current values integrated into the integrated value of detected current values are canceled out. Therefore, the product of T1 by $I_{offset1}$ and the product of T1 by $I_{offset2}$ are identical to the integrated value of the current values $I_{meas}$ that are detected during the period from the instant the battery is previously fully charged to the instant it is fully charged this time.

According to the expression (4), the integrated value Q of detected current values is divided by the length T of the period from the instant the battery is previously fully charged to the instant it is fully charged this time, that is, the integration period. Thus, the offset $I_{offset}$ can be calculated irrespective of the use form of the load L. Consequently, the detected current $I_{meas}$ is corrected by offsetting the offset $I_{offset}$. This results in the accurate charging/discharge current I of the battery. Thus, the remaining capacity SOC, can be measured highly precisely.

According to the present embodiment, as apparent from the expression (5), the correction value $I_{cor}$ used for offsetting an error equals the offset $I_{offset}$ calculated when the battery is fully charged. Alternatively, as seen from an expression (8) to be presented later, a weighted average may be calculated from the correction value $I_{cor}$ used to offset an error before the battery is fully charged this time and a newly calculated offset $I_{offset}$. The weighted average may be adopted as the correction value $I_{cor}$ used as the offset error.

$$I_{cor} = a \cdot I_{offset} + (1-a) \cdot I_{cor} \quad (8)$$

where a denotes a weight (0<a<1).

Otherwise, the offset values $I_{offset}$ calculated at several past times at which the battery was fully charged may be averaged and adopted as the correction value $I_{cor}$ used as the offset error. Alternatively, the integration period during which current values are detected and integrated in order to calculate the offset error may not be a period from the instant the battery is immediately previously fully charged to the instant it is fully charged this time. Instead, the integration period may be a period from the instant the battery is fully charged to the instant it is fully charged later with one or more instants, at which a fully-charged state is attained, between them. The current values detected during the period may be integrated.

Moreover, according to the present embodiment, when the predetermined time has elapsed since the instant the battery is previously fully charged, an amount of ac power to be generated by the alternator 10 is forcibly increased in order to fully charge the battery B. As long as the integrated value of current values that are detected during the period from the instant the battery is previously fully charged to the instant it is fully charged this time and the length of the period can be obtained, the present invention is not limited to the present embodiment.

Embodiments in which the Second Mode of the Present Invention is Implemented Embodiments 1 and 2, in which the second mode of the present invention is implemented, will be described in conjunction with the drawings below.

Embodiment 1

Figure 4:
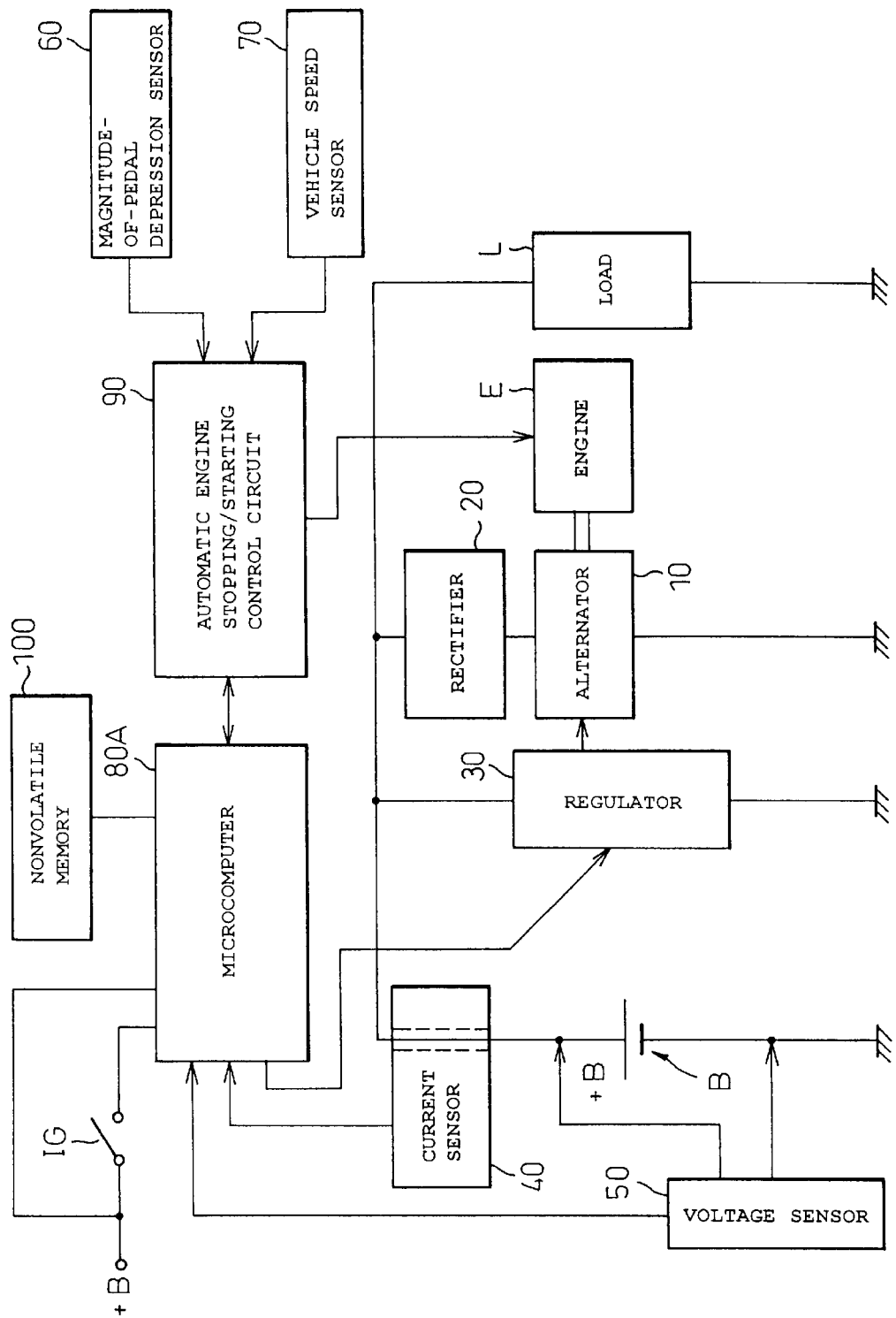
FIG. 4 is a block diagram showing Embodiment 1, in which the second mode of the present invention is implemented.

FIG. 4 shows an example in which the present invention is implemented in an automatic engine stopping/starting system for vehicles. A vehicle (automobile) includes, as shown in FIG. 4, a generator (alternator) 10, a rectifier 20 and a regulator 30. The alternator 10 is driven by an engine E of the automobile. The alternator 10 then generates ac power and applies an ac voltage. The rectifier 20 rectifies the ac voltage applied from the alternator 10, produces a rectified voltage, and applies the rectified voltage to a battery B and the regulator 30. The regulator 30 controls the output of the alternator 10 under the control of a microcomputer 80A, that will be described later, so that the output voltage will not be equal to or higher than an upper limit.

Moreover, the automatic engine stopping/starting system includes a current sensor 40, a voltage sensor 50, a magnitude-of-pedal depression sensor 60, and a vehicle speed sensor 70. The current sensor 40 detects a charging current or a discharge current of the battery B. The voltage sensor 50 detects the voltage at the terminals of the battery B. The magnitude-of-pedal depression sensor 60 detects a magnitude by which the accelerator pedal of the automobile has been depressed. The vehicle speed sensor 70 detects the vehicle speed of the automobile. Incidentally, the battery B is realized with a lead-acid battery, which is one type of battery.

Figure 6:
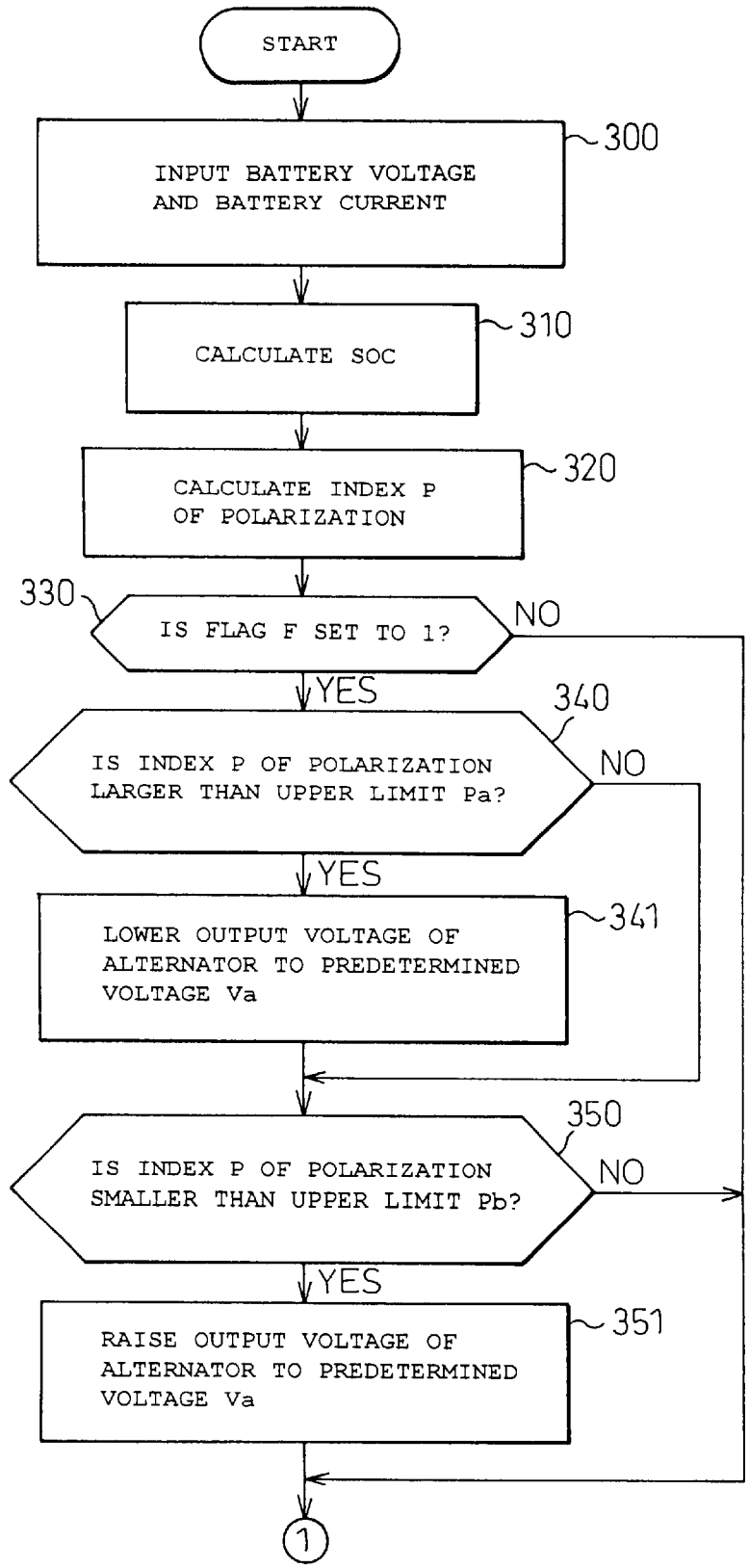
FIG. 6 is a first half of a flowchart describing a sub control program to be run by the microcomputer shown in FIG. 4.
Figure 7:
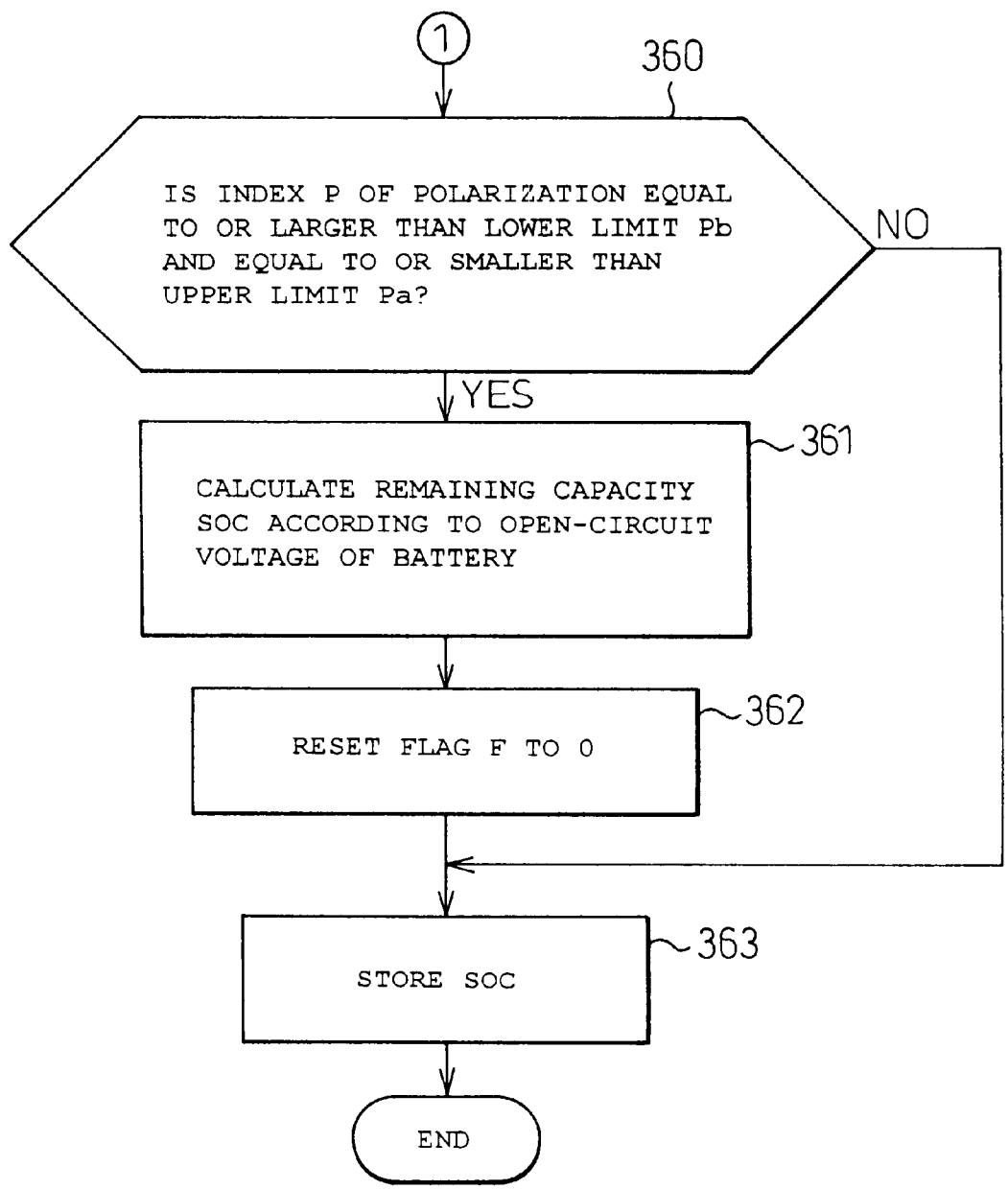
FIG. 7 is a second half of the flowchart describing the sub control program described in FIG. 6.

Moreover, the automatic engine stopping/starting system includes the microcomputer 80A, an automatic engine stop/start control circuit 90, and a nonvolatile memory 100. The microcomputer 80A runs a main control program and a sub control program that serves as an interrupt control program as described in the flowcharts of FIG. 5 to FIG. 7.

Figure 5:
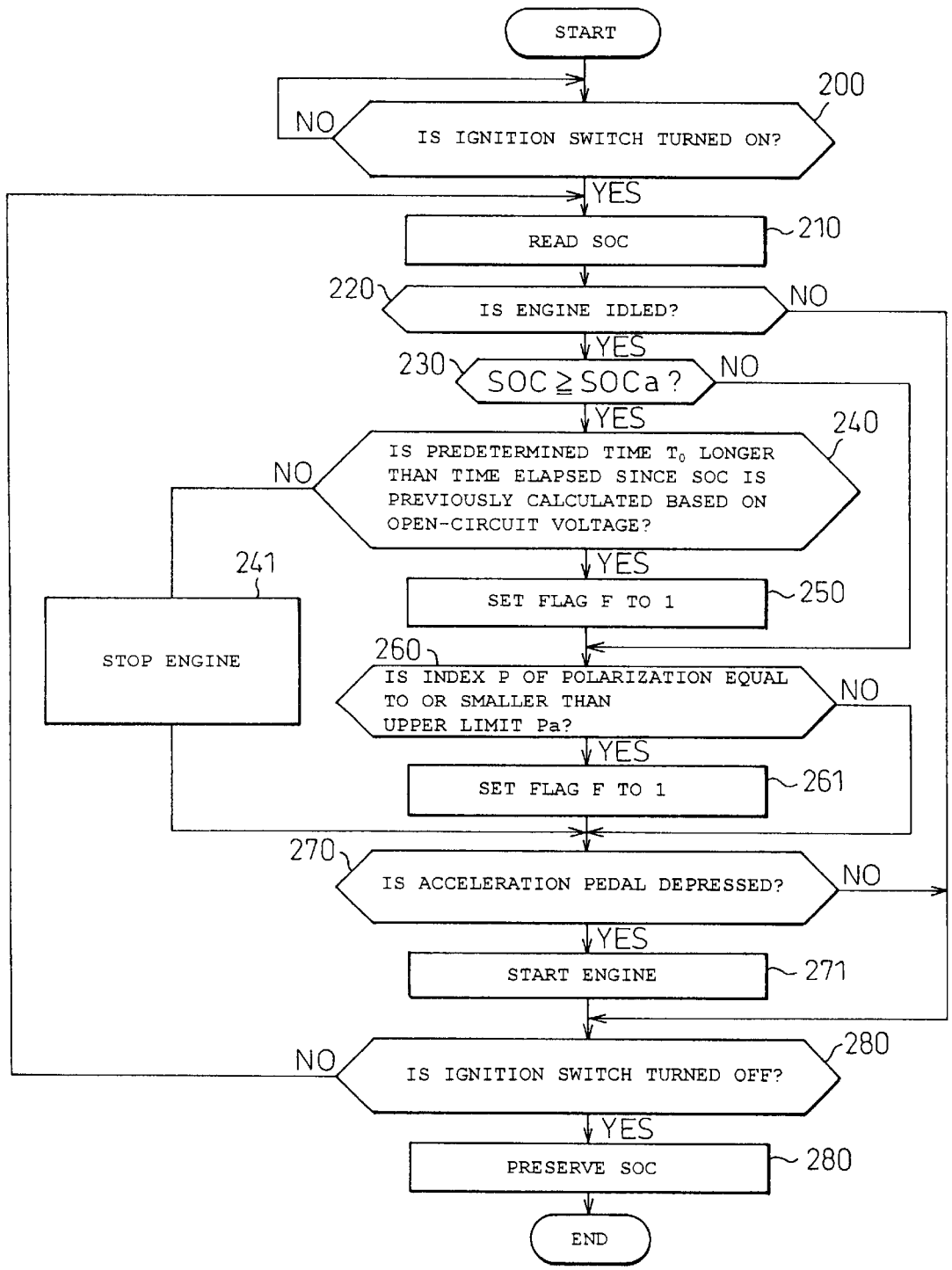
FIG. 5 is a flowchart describing a main control program to be run by the microcomputer shown in FIG. 4.

The microcomputer 80A runs the main control program described in the flowchart of FIG. 5 to enable automatic stopping and starting of the engine E at the time of halting or driving the automobile. Moreover, the microcomputer 80A runs the sub control program described in the flowcharts of FIG. 6 and FIG. 7 so as to calculate the remaining capacity of the battery B using a current detected by the current sensor 40 and a voltage detected by the voltage sensor 50.

According to Embodiment 1, the sub control program is run in response to an interrupt issued every time, the timer incorporated in the microcomputer 80A indicates the passage of a predetermined time. Power is always fed from the battery B to the microcomputer 80A. The microcomputer 80A runs the main control program, and resets and starts the timer when the ignition switch IG of the automobile is turned on. Moreover, the main control program and sub control program are stored in advance in a ROM incorporated in the microcomputer 80A.

The automatic engine stop/start control circuit 90 controls the engine E according to the outputs of the magnitude-of-pedal depression sensor 60 and vehicle speed sensor 70 so that the engine E will be automatically stopped or started. Data processed by the microcomputer 80A is stored in the nonvolatile memory 100.

In Embodiment 1 having the foregoing components, when the ignition switch IG is turned on, the automobile is driven with the start of the engine. At this time, when the ignition switch IG is turned on, the microcomputer 80A makes a judgment in the affirmative at step 200 described in the flowchart of FIG. 5. The microcomputer 80A then runs the main control program that is entered at step 210, and resets and starts the timer. Every time the timer indicates the passage of the predetermined time, the sub control program is run as described in the flowcharts of FIG. 6 and FIG. 7.

While the sub control program is running, at step 300 (see FIG. 6), a current detected by the current sensor 40 (hereinafter referred to as a battery current I) and a voltage detected by the voltage sensor 50 (hereinafter referred to as a battery voltage V) are transferred to the microcomputer 80A. At step 310, the remaining capacity SOC is calculated using the battery current I and the previous capacity SCO0 according to the expression (3).

In the expression (3), the previous capacity SOC0 is assigned only when the sub control program is run for the first time with the ignition switch IG turned on. At step 310, the previous remaining capacity SOC stored at step 280 is assigned to SOC0 in the expression (3) in order to calculate the present remaining capacity SOC. As mentioned above, the remaining capacity SOC is provided as a ratio in percentage of the actual capacity of the battery B to the capacity thereof attained when the battery B is fully charged. Moreover, C in the expression (3) denotes a rated capacity (A·sec) for the battery B, and t denotes a sampling time (sec).

Thereafter, at step 320, an index P of polarization is calculated based on the battery current I according to the following expression (9):

$$P = \int_{0}^{t1}(\gamma \cdot I - Id)dt \quad (9)$$

where γ denotes a correction term that permits correction of a variation in the efficiency of charging the battery B (whose solution becomes positive during charging of the battery B), and t denotes a time (sec). Moreover, Id denotes a correction term that permits correction of a variation stemming from a diffusion of electrolytic solution occurring near the electrodes of the battery B.

Assume that Po denotes a value of the index P of polarization attained immediately before a time instant t1, and a and b denote constants (inverse numbers of a time). In this case, when Po>0, Id=a·Po. When Po=0, Id=0. When Po<0, Id=b·Po. Incidentally, the expression (9) is stored in advance in the ROM incorporated in the microcomputer 80A.

Thereafter, at step 330, it is judged whether an SOC detection request flag F is set to 1. If it is judged at step 261 in FIG. 5 that the flag F is set to 1, the judgment of step 330 is made in the affirmative. At step 340, the index P of polarization is compared with a predetermined upper limit Pa. Herein, the upper limit Pa is an upper limit of the range of values assumed by the index of polarization within which the adverse effect of polarization on calculation of the remaining capacity SOC is thought to be limited.

If P>Pa in this stage, since the judgment of step 340 is made in the affirmative, the output voltage of the alternator 10 is lowered to a predetermined voltage Va at step 341. Consequently, the alternator 10 lowers its output voltage to the predetermined voltage Va. This means that a current flows into the battery B so as to lower the index of polarization to a value equal to or smaller than the upper limit Pa.

In contrast, if the judgment of step 340 is made in the negative, step 341 is unnecessary. The index P of polarization is then compared with a predetermined lower limit Pb at step 350. Herein, the lower limit Pb is a lower limit of the range of values to be assumed by the index of polarization within which the adverse effect of polarization on calculation of the remaining capacity SOC is thought to be limited.

If P<Pb in this stage, the judgment of step 350 is made in the affirmative. At step 351, the output voltage of the alternator 10 is raised to the predetermined voltage Va. Consequently, the alternator 10 raises its output voltage to the predetermined voltage Va. This means that a current flows into the battery B so as to increase the index of polarization to a value equal to or larger than the lower limit Pb.

In other words, when the remaining capacity SOC falls within a domain obviating the necessity of carefully controlling the remaining capacity SOC, if the SOC detection request flag F is set to 1, a voltage produced by the alternator 10 is controlled so that the index P will range from Pa to Pb, that is, polarization will be canceled.

If the judgment of step 330 is made in the negative, if the judgment of step 350 is made in the negative, or if step 351 is completed, it is judged at step 360 (see FIG. 7) whether the index P of polarization ranges from the lower limit Pb to the upper limit Pa. In short, if the SOC detection request flag F is not set to 1, steps 340 to 351 are skipped and control is passed to step 360.

If Pb≦P≦Pa is established, the judgment of step 360 is made in the affirmative. At the next step 361, the remaining capacity SOC of the battery B in this stage is calculated by referencing data (hereinafter referred to as $V_{open}$ vs. SOC data), which represents the relationship between the open-circuit voltage $V_{open}$ of the battery B and the remaining capacity SOC, according to the output V of the voltage sensor 50. The output V of the voltage sensor 50 represents the open-circuit voltage $V_{open}$ of the battery in this stage. The $V_{open}$ vs. SOC data is stored in advance in the ROM incorporated in the microcomputer 80A as a representation of the relationship of the remaining capacity SOC to the open-circuit voltage $V_{open}$ to which remaining capacity SOC is almost directly proportional.

When step 361 is completed, the SOC detection request flag F is reset to 0 at step 362. After step 362 is completed, or if the judgment of step 360 is made in the negative, the remaining capacity SOC in this stage is temporarily stored in the ROM in the microcomputer 80 at step 363.

As mentioned above, if the judgment of step 200 is made in the affirmative within the main control program, the remaining capacity SOC stored at step 363 is read at step 210. At step 220, it is judged from an output of the magnitude-of-pedal depression sensor 60 and an output of the vehicle speed sensor 70 whether the engine of the automobile is idling. Assume that the output of the magnitude-of-pedal depression sensor 60 indicates that the acceleration pedal of the automobile is released and the output of the vehicle speed sensor 70 indicates that the automobile is at a halt. In this case, the engine is idling. The judgment of step 220 is therefore made in the affirmative.

At step 230, the remaining capacity SOC in this stage is compared with a predetermined remaining capacity SOCa. The remaining capacity SOCa corresponds to the lower limit of the range of values to be assumed by the remaining capacity of the battery B within which restarting of the engine is enabled. If SOC≧SOCa, the judgement of step 230 is made in the affirmative. Consequently, at step 240, the time t having elapsed since the remaining capacity SOC is previously calculated at step 362 is compared with a predetermined time T0. The predetermined time T0 is a time long enough to ensure the reliability of the remaining capacity SOC.

If t≦T0 in this stage, it signifies that the reliability of the remaining capacity SOC is ensured. The judgment of step 240 is therefore made in the negative. The engine E is then stopped (step 241). Namely, the automatic engine stop/start control circuit 90 enables automatic stopping of the engine E. This means that when the automobile is driven again, the engine, E will be smoothly started but will not stall, because the remaining capacity SOC is appropriate. If the judgment of step 240 is made in the affirmative, the reliability of the remaining capacity SOC cannot be ensured. The SOC detection request flag F is therefore set to 1 at step 250.

After step 250 is completed, or if the judgment of step 230 is made in the negative, the index P of polarization is compared with the upper limit Pa at step 260. If P≦Pa in this stage, the judgment of step 260 is made in the affirmative. The SOC detection request flag F is set to 1 at step 261.

After the step 261 is completed, or after the step 240 is completed, it is judged from an output of the magnitude-of-pedal depression sensor 60 at step 270 whether the acceleration pedal of the automobile has been depressed.

If the acceleration pedal has been depressed, the judgment of step 270 is made in the affirmative. The engine E is started at step 271. Namely, the automatic engine stop/start control circuit 90 enables automatic starting of the engine E. This means that the engine E will be smoothly started, because the remaining capacity SOC is appropriate.

If the judgment of step 220 is made in the negative, if the judgement of step 270 is made in the negative, or after step 271 is completed, the judgment of step 280 is made in the negative because the ignition switch IG is on in this stage. Step 210 and subsequent steps are repeated again. If the ignition switch IG is turned off, the judgment of step 280 is made in the affirmative. At step 281, the remaining capacity SOCc in this stage is stored and preserved in the nonvolatile memory 100.

As described previously when the SOC detection request flag F is set to 1, if the index P of polarization calculated according to the aforesaid expression (9) exceeds the upper limit Pa, the output voltage of the alternator 10 is lowered to the predetermined voltage Va. If the index P of polarization is smaller than the lower limit Pb, the output voltage of the alternator 10 is raised to the predetermined voltage Va. Thus, the index P of polarization can be converged to the range of Pb≦P≦Pa. Consequently, even if the automobile runs in such a manner that the battery B must be charged for a long period of time, the index P of polarization can be actively retained within the range of Pb≦P≦Pa.

In other words, the output voltage of the alternator is actively controlled so that the index P of polarization will fall within the range of Pb≦P≦Pa with a change in the index P canceled. The remaining capacity SOC is calculated by referencing the SOC vs. $V_{open}$ data using the open-circuit voltage of the battery B. The calculation of the remaining capacity SOC using the open-circuit voltage f the battery B is performed timely and highly precisely, if necessary. Consequently, unexpected exhaustion of the battery can be prevented, and overcharge can be prevented. Eventually, the service life of the battery can be extended.

Moreover, the remaining capacity SOC is used to judge whether automatic stopping of the engine E is enabled. This results in improved precision in judgment. In other words, if the remaining capacity SOC is equal to or larger than the lower limit of the range of SOC values permitting re-actuation of the engine E, automatic stopping of the engine E can be achieved precisely. In contrast, if the remaining capacity SOC falls below the lower limit of the range of SOC values permitting re-actuation of the engine E, automatic stopping of the engine E can be inhibited highly precisely, and stalling of the engine can be prevented reliably.

Embodiment 2

Figure 8:
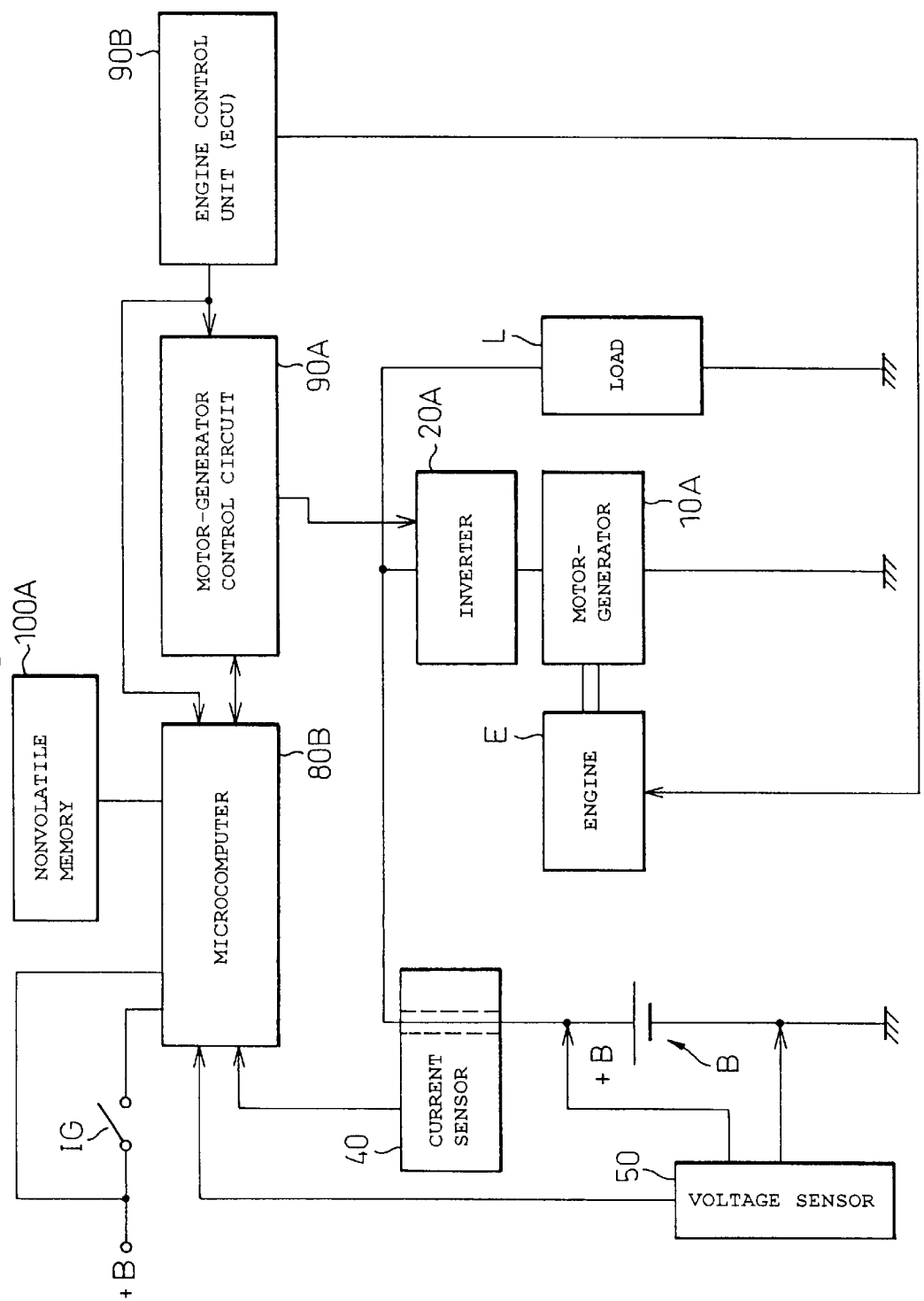
FIG. 8 is a block diagram showing Embodiment 2, in which the second mode of the present invention is implemented.
Figure 9:
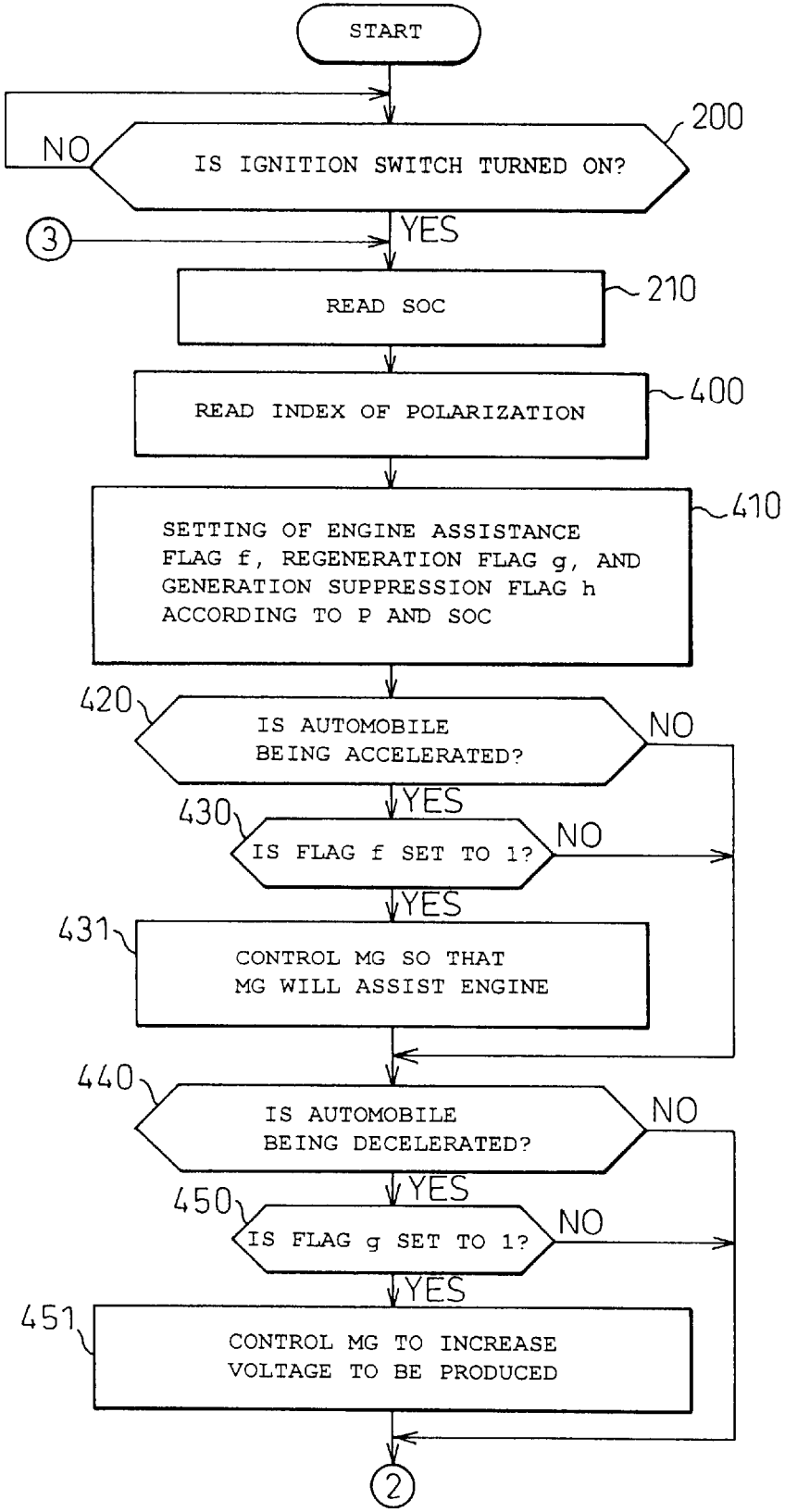
FIG. 9 is a first half of a flowchart describing a main control program to be run by a microcomputer employed in Embodiment 2 shown in FIG. 8.
Figure 10:
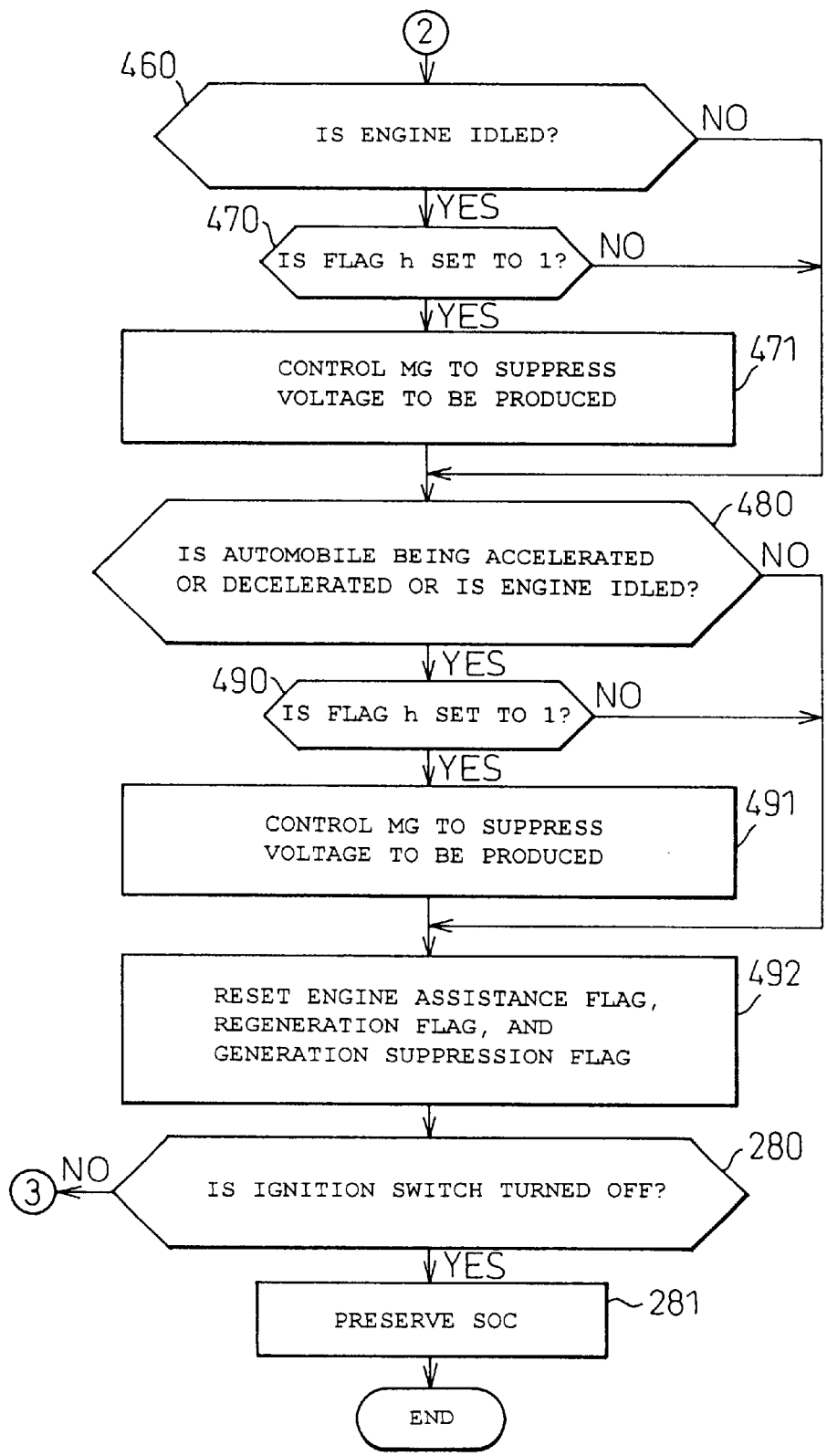
FIG. 10 is a second half of the flowchart describing the main control program employed in Embodiment 2 shown in FIG. 8.

Next, Embodiment 2 in which the second mode of the present invention is implemented will be described in conjunction with FIG. 8 to FIG. 12. FIG. 8 shows an example 1 in which the present invention is implemented in a motor-generator control system for automobiles. An automobile includes a motor-generator (MG) 10A. The MG 10A is driven by an engine E and thus generates power or assists the engine E. An inverter 20A controls the power generated by the MG 10A so as to charge the battery B described in relation to Embodiment 1. Moreover, the inverter 20A controls power supplied from the battery B and feeds the power to the load L described in relation to Embodiment 1.

A motor-generator (MG) control circuit 90A is controlled by an engine control unit ECU 90B under the control of a microcomputer 80B, and controls the inverter 20A. The engine control unit ECU 90B not only controls the MG control-circuit 90A but also controls the engine The microcomputer 80B runs a main control program and a sub control program serving as an interrupt control program as described in the flowcharts of FIG. 9 to FIG. 11. The microcomputer 80B runs the main,control program as described in the flowcharts of FIG. 9 and FIG. 10 so as to allow the MG 10A to assist the engine or control the output of the MG 10A.

Figure 11:
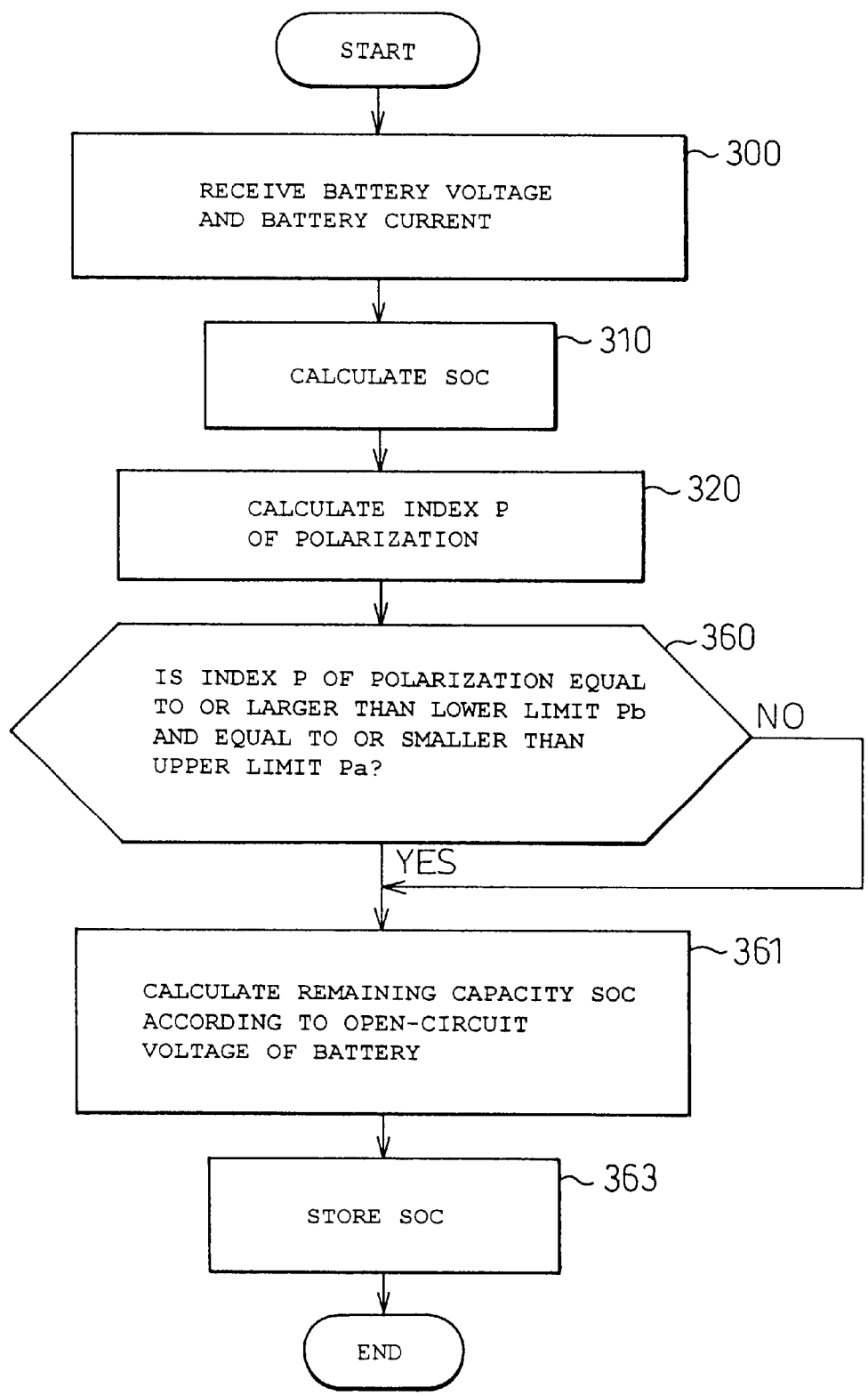
FIG. 11 is a flowchart describing a sub control program to be run by the microcomputer employed in Embodiment 2 shown in FIG. 8.

Moreover, the microcomputer 80B runs the sub control program as described in the flowchart of FIG. 11 so as to calculate the remaining capacity of the battery B using a current detected by the current sensor 40 described in relation to Embodiment 1. It should be noted that the flowcharts of FIG. 9 and FIG. 10 include the same steps as the flowchart of FIG. 5, except steps 220 to 271 that are replaced with steps 400 to 492. The flowchart of FIG. 11 includes the same steps as the flowcharts of FIG. 6 and FIG. 7, except steps 330 to 351 and step 362.

According to Embodiment 2, the sub control program is run in response to an interrupt issued at intervals of a predetermined time whose passage is indicated with a timer incorporated in the microcomputer 80B. Power is always supplied from the battery B to the microcomputer 80B. The microcomputer 80B runs the main control program, and resets and starts the timer with the ignition switch IG of the automobile turned on. Moreover, the main control program and sub control program are stored in advance in the ROM incorporated in the microcomputer 80B. Data processed by the microcomputer 80B is stored in a nonvolatile memory 100A.

In Embodiment 2 having the foregoing components, when the ignition switch IG is turned on, the engine is started and the automobile is driven. At this time, since the ignition switch IG is turned on, the microcomputer 80B makes a judgment in the affirmative at step 200 in the flowchart of FIG. 9. The main control program entered at step 210 is then run, and the timer is reset to start. The sub control program is run to start at intervals of the predetermined time, passage of which is indicated by the timer, as described in the flowchart of FIG. 11.

While the sub control program is running, similarly to Embodiment 1, the remaining capacity SOC and the index P of polarization are calculated at steps 300 to 320. Thereafter, steps 330 to 351 described in relation to Embodiment 1 are not executed. At steps 360 to 363, as described in relation to Embodiment 1, it is judged whether the index P of polarization falls within the range of $Pb \leq P \leq Pa$, and the remaining capacity SOC is calculated based on the open-circuit voltage of the battery B and stored.

As mentioned above, if the judgment of step 200 within the main control program is made in the affirmative, the remaining capacity SOC stored at step 363 is read at step 210 in the same manner as it is in Embodiment 1. At step 400, the index P of polarization calculated at step 320 is read.

Thereafter, at step 410, a map listing, as shown in FIG. 12, conditions defined with the remaining capacity SOC or the index P of polarization is referenced in order to set or reset an engine assistance flag f, a regeneration flag g, and a generation suppression flag h, according to the remaining capacity SOC and the index P of polarization.

Namely, when the index P of polarization is equal to or larger than the lower limit Pb and equal to or smaller than the upper, limit Pa, if the remaining capacity SOC is equal to or larger than SOC1 and equal to or smaller than SOC2, the flags f and g are set to 1s, and the flag h is reset to 0.

If the remaining capacity SOC is smaller than SOC1, the flag f is reset to 0, the flag g is set to 1, and the flag h is reset to 0.

Moreover, if the remaining capacity SOC is larger than SOC2, the flag f is set to 1, the flag g is set to 1, and the flag h is set to 1.

On the other hand, when P<Pb, if the remaining capacity SOC is smaller than SOC1 or if the remaining capacity SOC is equal to or larger than SOC1 and equal to or smaller than SOC2, the flag f is reset to 0, the flag g is, set to 1, and the flag h is reset to 0. If SOC2<SOC, the flag f is set to 1, the flag g is set to 1, and the flag h is set to 1.

When Pa<P, if the remaining SOC is smaller than SOC, the flag f is reset to 0, the flag g is set to 1, and the flag h is reset to 0. If the remaining capacity SOC is equal to or larger than SOC1 and equal to or smaller than SOC2, the, flag f is set to 1, the flag g is set to 1, and the flag h is set to 1. If the remaining capacity SOC is larger than SOC2, the flag f is set to 1, the flag g is reset to 0, and the flag h is set to 1.

Note that SOC1 and SOC2 denote the lower limit and upper limit of a permissible range of values to be assumed by the remaining capacity SOC. The map shown in FIG. 12 is stored in advance in the ROM in the microcomputer 80B.

At step 420, it is judged whether the automobile is being accelerated. If the engine control unit ECU transmits a signal, which indicates that the automobile is being accelerated, to the microcomputer 80B, a judgment is made in the affirmative at step 420. Accordingly, it is judged at step 430 whether the engine assistance flag f is set to 1.

If the engine assistance flag f is set to 1 at step 410, since f=1 signifies that the engine E requires assistance, a judgment is made in the affirmative at step 430. At step 431, the MG 10A is controlled so that the MG 10A will assist the engine E.

Assume that the index P of polarization is smaller than the lower limit Pb of the range of values permitting detection of the remaining capacity SOC, and the remaining capacity SOC is larger than the upper limit SOC2. In this case, the MG 10A is controlled so that an average of discharge current values detected during a time interval sufficiently shorter than a time constant 1/b where b is the constant b employed in the expression (9) will not exceed a current value expressed as b·Pb/γ.

Consequently, the MG control circuit 90A controls the MG 10A so that the MG 10A will assist the engine E via the inverter 20A. This causes the engine E to raise its output voltage. That is to say, a current flows into the battery B so as to lower the index P of polarization to a value equal to or smaller than the upper limit Pa. Eventually, while the property of the battery of receiving a charging current is improved, exhaustion of the battery is prevented.

If the judgment of step 420 is made in the negative or if the judgment of step 430 is made in the negative, it is judged at step 440 whether the automobile is being decelerated. If the engine control unit ECU has transferred a signal, which indicates that the automobile is being decelerated, to the microcomputer 80B, the judgment of step 440 is made in the affirmative.

If the regeneration flag g is set to 1 at step 410, the flag g=1 signifies that a voltage produced by the MG 10A must be raised. Consequently, the judgment of step 450 is made in the affirmative, the voltage produced by the MG 10A is raised at step 451. Consequently, the MG control circuit 90A controls the MG 10A via the inverter 20A so as to raise the voltage to be produced by the MG 10A.

Herein, assume that the index P of polarization is smaller than the lower limit Pb and the remaining capacity SOC is larger than the upper limit SOC2. In this case, as mentioned above, the voltage to be produced by the MG 10A is controlled so that an average of discharge current values detected during a time interval sufficiently shorter than a time constant 1/b where b is the constant b employed in the expression (9) will not exceed a current value expressed as b·Pb/γ. In contrast, assume that the index P of polarization is larger than the upper limit Pa and the remaining capacity SOC is smaller than the lower limit SOC1. In this case, the voltage to be produced by the MG 10A is controlled so that an average of discharge current values detected during a time interval sufficiently shorter than a time constant 1/a where a is the constant a employed in the expression (9) will not exceed a current value expressed as a·Pa/γ.

Thereafter, at step 460, a judgment is made similarly to step 220 in FIG. 5. Herein, if the engine E is idling, the judgment of step 460 is made in the affirmative. It is then judged at step 470 whether the generation suppression flag h is set to 1. If the generation suppression flag h is set to 1 at step 410, since h=1 signifies that the voltage to be produced by the MG 10A must be suppressed, a judgment is made in the affirmative at step 470. Based on, the judgment, the voltage to be produced by the MG 10A is suppressed at step 471. Consequently, the MG control circuit 90A controls the MG 10A via the inverter 20A. So as to suppress the voltage to be produced by the MG 10A. This means that a current flows into the battery B so as to increase the index P of polarization to a value equal to or larger than the lower limit Pb.

Herein, if the index P of polarization is smaller than the lower limit Pb and the remaining capacity SOC is larger than the upper limit SOC2, the voltage to be produced by the MG 10A is controlled in the same manner as mentioned above. Namely, the voltage to be produced by the MG 10A is controlled so that an average of discharge current values detected during a time interval sufficiently shorter than a time constant 1/b where b is the constant b employed in the expression (9) will not exceed a current value expressed as b·Pb/γ.

Thereafter, at step 480, it is judged whether the automobile is being accelerated or decelerated and whether the engine E is idling. If the automobile is being neither accelerated nor decelerated and the engine E is not idling, the judgment of step 480 is made in the affirmative. Similarly to step 470, it is judged at step 490 whether the generation suppression flag h is set to 1.

If the judgment of step 490 is made in the affirmative, the voltage to be produced by the MG 10A is suppressed at step 491 similarly to at step 471. Consequently, the MG control circuit 90A controls the MG 10A via the inverter 20A so as to suppress the voltage to be produced by the MG 10A.

Herein, if the index P of polarization is smaller than the lower limit Pb and the remaining capacity SOC is larger than the upper limit SOC2, the voltage to be produced by the MG 10A is controlled in the same manner as mentioned above. Namely, the voltage to be produced by the MG 10A is controlled so that an average of discharge current values detected during a time interval sufficiently shorter than a time constant 1/b where b is the constant b employed in the expression (9) will not exceed a current value expressed as b·Pb/γ.

If the judgement of step 480 or step 490 is made in the negative or after step 491 is completed, the flags f, g, and h are reset to 0s at step 492. Step 280 and subsequent steps are then performed in the same manner as they are in Embodiment 1.

As described previously, the output voltage of the MG 10A is controlled so that the index P of polarization will be actively converged to the range of Pb≦P≦Pa. Calculation of the remaining capacity SOC using the open-circuit voltage of the battery B can be performed timely and highly precisely. Furthermore, the property of the battery B of receiving a charging current is maintained satisfactorily. The battery can therefore be efficiently charged at a required timing. Thus, energy can be collected efficiently.

Embodiments in which the Third Mode of the Present Invention is Implemented

Embodiments a to e in which the third mode of the present invention is implemented will be described in conjunction with the drawings below.

Embodiment a

Figure 13:
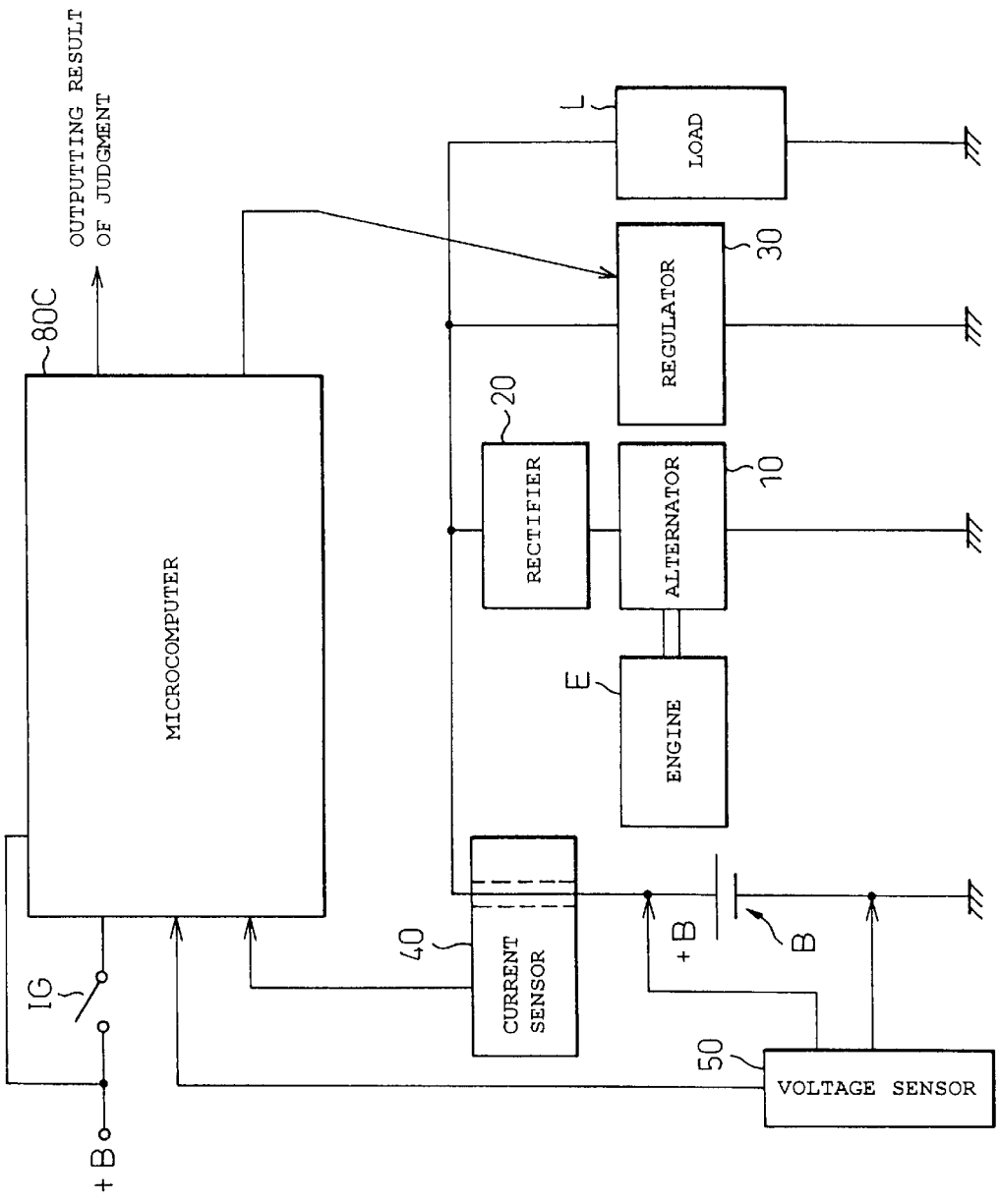
FIG. 13 is a block diagram showing Embodiment a, in which the third mode of the present invention is implemented.

FIG. 13 shows Embodiment a of a charging control system that controls charging of a battery B for automobiles and in which the present invention is implemented. The battery B is realized with a lead-acid battery, which is one type of battery.

The charging control system includes, as shown in FIG. 13, an alternator 10, a rectifier 20, and a regulator 30. The alternator 10 produces an ac voltage when being driven by an engine of an automobile. The rectifier 20 rectifies the ac voltage produced by the alternator 10, produces a rectified voltage, and applies the rectified voltage to the battery B and regulator 30. The regulator 30 regulates the voltage rectified by the rectifier 20 under the control of a microcomputer 80C 10 that will be described later, and transfers the resultant voltage to the battery B and an electrical load L.

Moreover, the charging control system includes a current sensor 40, a voltage sensor 50, and a microcomputer 80C. The current sensor 40 detects a charging current of the battery B or a discharge current thereof. The voltage sensor 50 detects the voltage at the terminals of the battery B.

Figure 14:
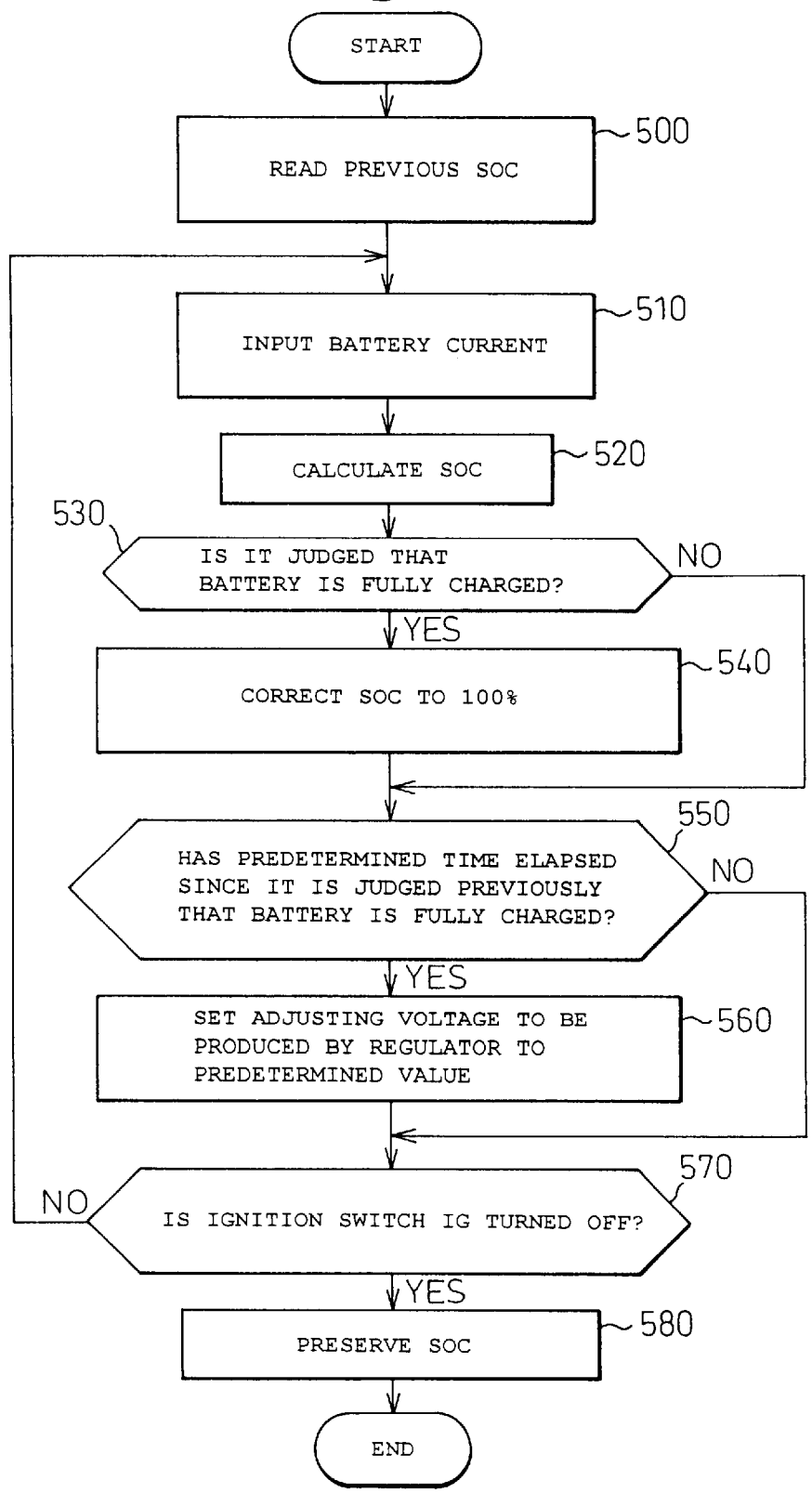
FIG. 14 is a flowchart describing a main control program to be run by a microcomputer shown in FIG. 13.
Figure 15:
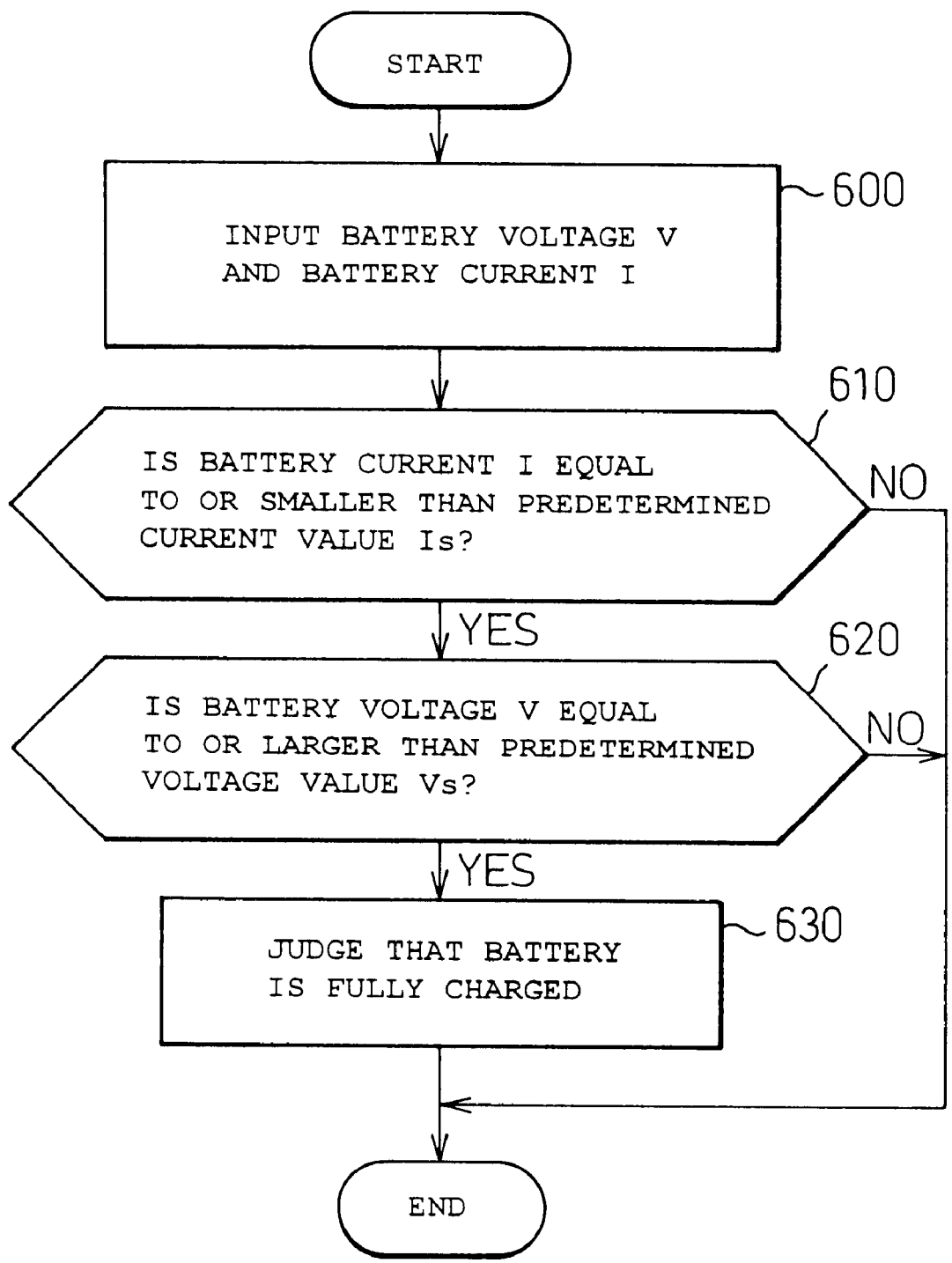
FIG. 15 is a flowchart describing a sub control program to be run by the microcomputer shown in FIG. 13.

The microcomputer 80C runs a main control program and a sub control program serving as an interrupt control program as described in the flowcharts of FIG. 14 and. FIG. 15. While the main control program is running, the microcomputer 80C judges from a current detected by the current sensor 40 whether the battery B is fully charged. Moreover, the microcomputer 80C performs processing required to control the regulator 30 or stores data in a memory. Moreover, while the subcontrol program is running, the microcomputer 80C judges a current detected by the current sensor 40 and a voltage detected by the voltage sensor 50.

According to Embodiment a, the sub control program is run in response to an interrupt issued at intervals of a predetermined time whose passage is indicated by a timer incorporated in the microcomputer 80C. Power is always supplied from the battery B to the microcomputer 80C, and the microcomputer 80C is therefore always active. When the ignition switch IG of the automobile is turned on, the main control program is run to start, and the timer is reset to start. Incidentally, the main control program and sub control program are stored in advance in the ROM in the microcomputer 80C.

In Embodiment a having the foregoing components when the ignition switch IG is turned on, the automobile is driven with the starting of the engine. At this time, when the ignition switch IG is turned on, the microcomputer 80C is activated. The main control program starts to run as described in the flowchart of FIG. 14. The timer is reset to start. The sub control program starts to run as described in the flowchart of FIG. 15 at intervals of a predetermined time whose passage is indicated by the timer.

While the sub control program is running, a current detected by the current sensor 40 (hereinafter a battery current I) and A voltage detected by the voltage sensor 50 (hereinafter a battery voltage V) are transferred to the microcomputer 80C. At steps 610 and 620, the battery current I and battery voltage V are compared with a predetermined current value Is and a predetermined voltage value Vs respectively.

Figure 16:
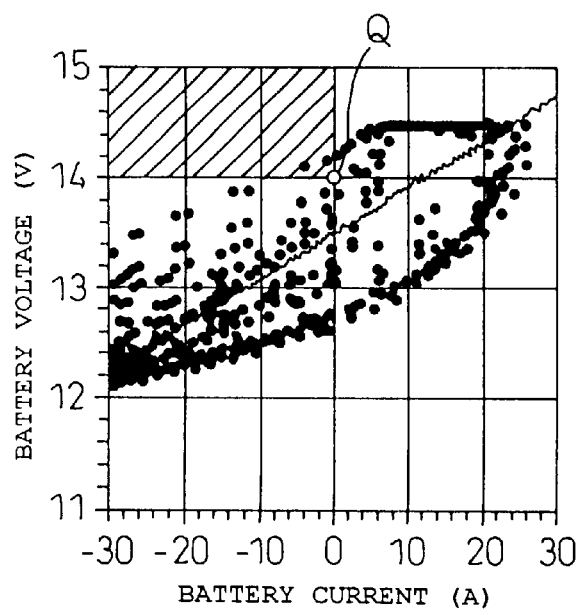
FIG. 16 is a graph indicating the relationship between a battery voltage and a battery current established when a battery is fully charged, and containing a fully-charged state judgment range.

The predetermined current value Is and predetermined voltage value Vs are introduced in order to judge whether the battery is fully charged. The grounds on which the values are introduced will be described below. Namely, the distribution of battery voltage values and the distribution of battery current values were examined with the battery B fully charged. FIG. 16 shows the results of the examination it should be noted that the battery B is realized by connecting six lead-acid batteries, for which the rated voltage is set to 12 V, in series with one another.

FIG. 16 demonstrates that the fully-charged state of the battery B can be judged highly precisely. Namely, if the terminal voltage of the battery B and the current flowing through the battery B fall within a domain specified with voltage values equal to or larger than 14 V and current values equal to or smaller than 0 A (hatched part of FIG. 16), the battery B is judged to be fully charged. Herein, the reason why the terminal voltage of the battery B should be equal to or larger than 14 V is that the terminal voltage of the battery B rises to be higher than the rated voltage for the battery B when the battery B is almost fully charged. Therefore, such a high voltage is adopted in order to judge a fully-charged state. In FIG. 16, point Q represents the battery voltage V of 14 V and the battery current I of 0 A.

The reason the current flowing through the battery B should be equal to or smaller than 0 A will be described below. Namely, a current flows into the battery B during charging of the battery B. The terminal voltage of the battery B is raised with a voltage drop stemming from internal resistance. Moreover, a current flows out of the battery B during discharging of the battery B. The terminal voltage of the battery B is lowered with a voltage drop stemming from internal resistance. Consequently, 0 A or less is adopted as the value of the current flowing through the battery B in order to judge the fully-charged state.

As mentioned above, it is adopted as a criterion for the fully-charged state of the battery B that the terminal-voltage of the battery B and the current flowing through it should belong to a domain defined with voltage values equal to or larger than 14 V and current values equal to or smaller than 0 A. Compared with when whether the battery B is fully charged is judged from the voltage at the terminals of the battery B, the precision in judgment improves markedly. In Embodiment a, therefore, the predetermined current value Is and predetermined voltage value Vs are set to 0A and 14 V respectively and introduced in order to judge the fully-charged state of the battery B.

Figure 17:
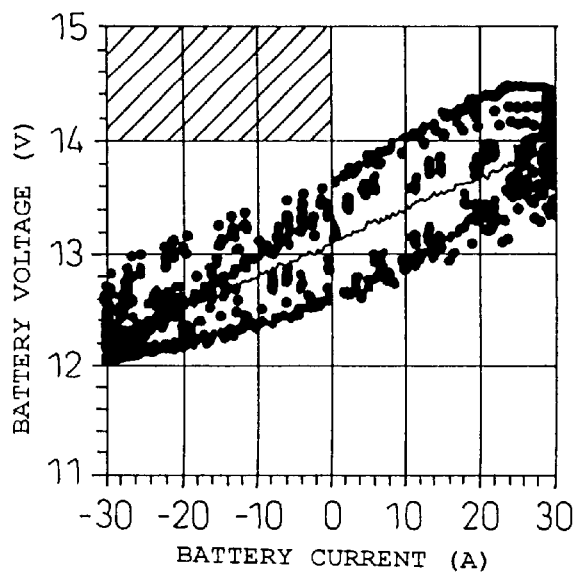
FIG. 17 is a graph indicating the relationship between a battery voltage and a battery current established when a battery is charged 90%, and containing a fully-charged state judgment range.

If the battery B is charged 90%, the battery voltage and the battery current do not fall within the domain expressed as a hatched part of FIG. 17 (the same as the hatched part of FIG. 16). Based on this fact, whether the battery B is fully charged can be judged.

As mentioned above, when "battery current I≦predetermined current value Is" and "battery voltage V≧predetermined voltage value Vs" are met, the judgments of steps 610 and 620 are made in the affirmative. It is judged at step 630 that the battery B is fully charged.

Moreover, as mentioned above, when the main control program is run to start, before the ignition switch IG is turned on, the remaining capacity SOC representing the charged state of the battery B and being stored at step 580 is read as a previous value SOC0 from the ROM in the microcomputer 80C at step 500 in FIG. 14. Herein, the remaining capacity SOC is provided as a ratio in percentage % of the actual capacity of the battery B to the capacity thereof attained when the battery B is fully charged.

At step 510, a current detected by the current sensor 40 is read as the battery current I. At step 520, the remaining capacity SOC is calculated based on the battery current I and previous value SOC0 according to the aforesaid expression (3). As mentioned previous, C denotes the rated capacity (A·sec) for the battery B and t denotes a sampling time (sec).

Thereafter, at step 530, it is judged whether the battery B is fully charged. If the sub control program is run with issuance of an interrupt, it is judged at step 53 whether the battery is fully charged. In this case, the judgment of step 530 is made in the affirmative. At step 540, the remaining capacity SOC is corrected to 100%. A judgment is then made at step 550. In contrast, if the judgment of step 530 is made in the negative, the remaining capacity SOC is not corrected, but remains set to the previous value SOC0. The judgment of step 550 is then made.

At step 550, it is judged whether a predetermined time has elapsed since it is judged at step 530 that the battery is fully charged. If the predetermined time has elapsed, it is judged that the remaining capacity SOC of the battery B has decreased from that attained in the fully-charged state. The judgment of step 550 is therefore made in the affirmative. At step 560, an adjusting voltage to be produced by the regulator 30 is set to a predetermined voltage value in order to increase an amount of ac power to be generated by the alternator 10 and to thus fully charge the battery B. Accordingly, the adjusting voltage to be produced by the regulator 30 is controlled and set to the predetermined voltage value by the microcomputer 80C.

Since the ignition switch IG is not turned off, if the judgment of step 570 is made in the negative, step 510 and subsequent steps are repeated. If the ignition switch IG is turned off, the judgment of step 570 is made in the affirmative. At step 580, the remaining capacity SOC in this stage is stored and preserved in the RAM in the microcomputer 80C.

As described above, the sub control program is run in order to judge the fully-charged state of the battery B. At this time, if the battery current I is equal or smaller than the predetermined current value Is and the battery voltage V is equal to or larger than the predetermined voltage value Vs, the battery B is judged to be fully charged. Compared with when whether the battery B is fully charged is judged from the terminal voltage of the battery B, the fully-charged state of the battery, B can be judged highly precisely. Using this method of judging whether a battery is fully charged, the remaining capacity SOC of the battery B can always be calculated highly precisely.

In this case, as mentioned above, every time the predetermined time has elapsed since it is judged that the battery B is fully charged, an adjusting voltage to be produced by the regulator 30 is set to the predetermined voltage value so that an amount of ac power to be generated by the alternator 10 will be increased in order to thus fully charge the battery B. Judgment on the fully-charged state of the battery B and calculation of the remaining capacity SOC can be achieved highly precisely while being unaffected by regulation of a voltage produced by the alternator 10 performed by the regulator 30. Consequently, overcharge of the battery B can be prevented and the service life of the battery B can be extended.

Embodiment b

Figure 18:
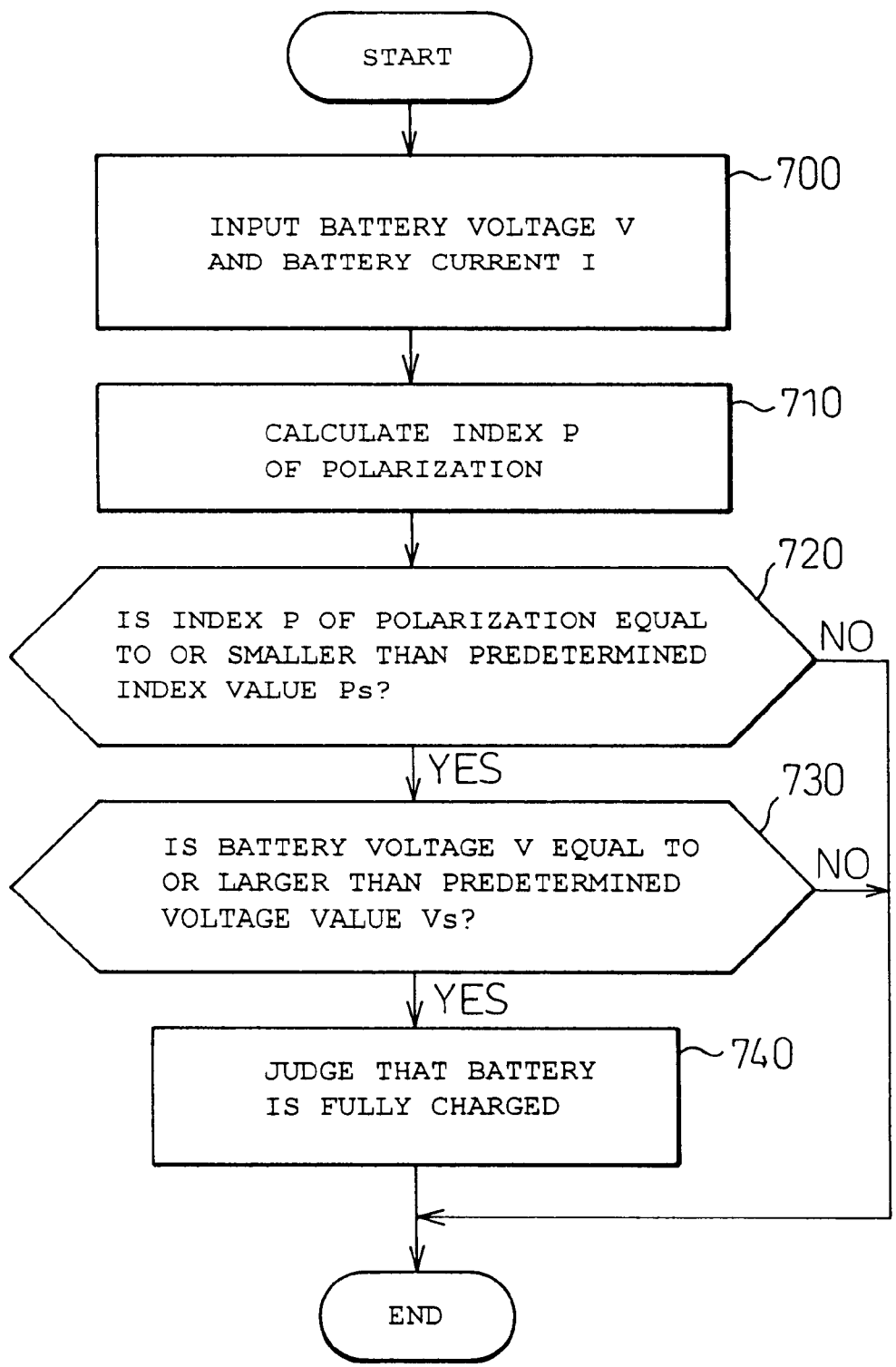
FIG. 18 is a flowchart describing a sub control program employed in Embodiment b, in which the third mode of the present invention is implemented.

Next, Embodiment b in which the third mode of the present invention is implemented will be described in conjunction with FIG. 18. For Embodiment b, the flowchart of FIG. 18 is substituted for the flowchart of FIG. 15 described in relation to Embodiment a. According to Embodiment b, the microcomputer 80C described in relation to Embodiment a runs, as described in the flowchart of FIG. 18 instead of the flowchart of FIG. 15, the subcontrol program in response to an interrupt issued at intervals of a time whose passage is indicated by the timer. The other components are identical to those of Embodiment a.

In Embodiment b having the foregoing components, when an automobile is driven, the microcomputer 80C runs and starts the main control program as described in the flowchart of FIG. 14, and also starts, as described in the flowchart of FIG. 18, running the sub control program along with issuance of an interrupt at intervals of a time whose passage is indicated by the timer.

When the sub control program is run, a voltage detected by the voltage sensor 50 and a current detected by the current sensor 40 are transferred as a battery voltage V and a battery current I to the microcomputer 80C at step 300 in FIG. 18. At step 710, the index P of polarization is calculated based on the battery current I (A) according to the aforesaid expression (9). As mentioned above, $\gamma$ denotes a correction term that permits correction of a variation of the efficiency in charging the battery B (becomes positive during charging of the battery B), and t denotes a time (sec). Moreover, Id, denotes a correction term that permits correction of a change in the concentration of electrolytic solution in the battery B. Assume that Po denotes a value the index P assumes immediately before time instant t1, and that a and b denote constants. In this case, when Po>0, Id=a·Po. When Po=0, Id=0. When P<0, Id=b·Po. Incidentally, the expression (9) is stored in advance in the ROM in the microcomputer 80C.

As mentioned above, when the index P is calculated, the index P of polarization and the battery voltage V are compared with a predetermined index value Ps and a predetermined voltage value Vs respectively at steps 720 and 730.

The predetermined index value Ps and predetermined voltage value Vs are introduced in order to judge whether the battery B is fully charged. The grounds on which the values are introduced will be described below. As mentioned above, while the automobile is running, a rise in the terminal voltage of the battery B is not always associated with the fully-charged state thereof because of polarization. Therefore, even when the rise in the terminal voltage of the battery is monitored, the fully-charged state cannot be judged precisely.

According to Embodiment b, a parameter based on which polarization stemming from charging or discharging of the battery B is estimated in relation to the history of charging/discharge current values, and a rise in a battery voltage occurring when the battery B is almost fully charged are monitored. When the effect of polarization is presumed to be limited, if the battery voltage rises, it is judged that the battery B is fully charged. Thus, the fully-charged state of the battery B can be judged highly precisely. Moreover, the remaining capacity SOC can be calculated highly precisely by utilizing the judgment.

From the foregoing viewpoint, according to Embodiment b, the predetermined voltage value Vs described in relation to Embodiment a is introduced. Besides, the predetermined index value Ps (=1000 Asec to 2000 Asec) is introduced on behalf of the predetermined current value Is described in relation to Embodiment a. The predetermined index value Ps is not limited to the range from 1000 Asec to 2000 Asec because polarization stems from a change in the concentration of electrolytic solution. Alternatively, the predetermined index value Ps may be any value permitting negligence of the change in the concentration of electrolytic solution, that is, a value unsusceptible to polarization.

Consequently, when "index P of polarization$\leq$predetermined index value Ps" and "battery voltage V$\geq$predetermined voltage value Vs" are met, the judgments of steps 720 and 730 are made in the affirmative. At step 740, it is judged that the battery B is fully charged. Similarly to Embodiment a, control is then passed to step 530 in the main control program. Unlike Embodiment a, it is judged from the judgment made at step 740 (see FIG. 18) whether the battery B is fully charged. The other steps included in the main control program are identical to those employed in Embodiment a.

As described previously, in Embodiment b, when it is found within the sub control program that the index P of polarization is equal to or smaller than the predetermined index value Ps and the battery voltage V is equal to or larger than the predetermined voltage value Vs, it is judged that the battery B is fully charged. Therefore compared with when whether battery B is fully charged is judged from the terminal voltage of the battery B, whether the battery B is fully charged can be judged highly precisely without being unaffected by polarization. Using this method of judging whether a battery is fully charged, the remaining capacity SOC of the battery B can be calculated highly precisely all the time. The other advantages are identical to those of Embodiment a.

Embodiment c

Figure 19:
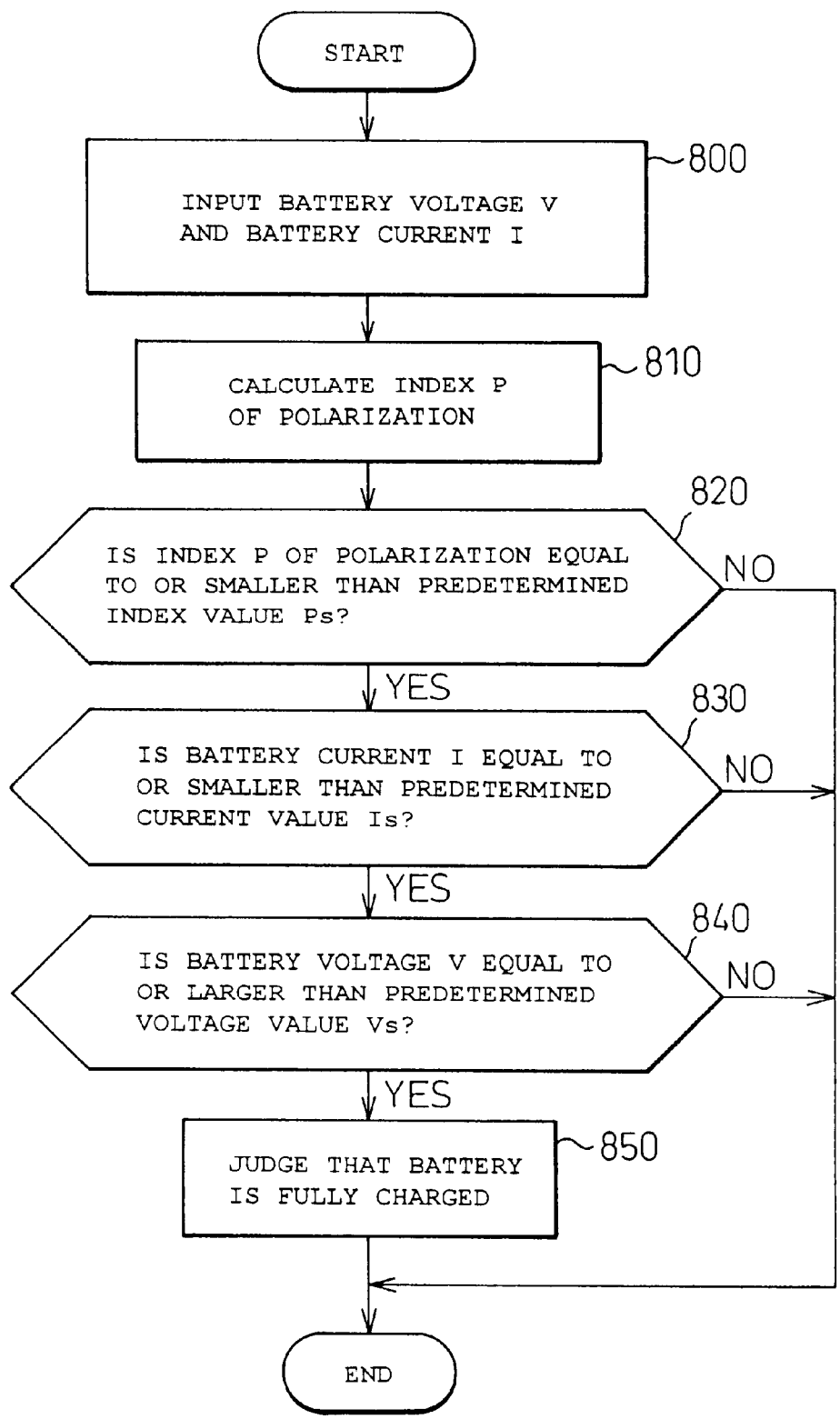
FIG. 19 is a flowchart describing a sub control program employed in Embodiment c, in which the third mode of the present invention is implemented.

Next, Embodiment c in which the third mode of the present invention is implemented will be described in conjunction with FIG. 19. For Embodiment c, the flowchart of FIG. 19 is adopted on behalf of the flowchart of FIG. 15 described in relation to Embodiment a. In Embodiment c, the microcomputer 80C described in relation to Embodiment a runs, as described in the flowchart of FIG. 19 substituted for the flowchart of FIG. 15, the sub control program in response to an interrupt issued at intervals of a time whose passage is indicated by the timer.

Incidentally, the flowchart of FIG. 19 is made up of step 800 equivalent to step 600 in FIG. 15, steps 810 and 820 equivalent to steps 710 and 720 in FIG. 18, and steps 830, 840, and 850 equivalent to steps 610, 620, and 630 in FIG. 15. The other components are identical to those of Embodiment a.

In Embodiment c having the foregoing components, when an automobile is driven, the microcomputer 80C runs and starts the main control program as described in the flowchart of FIG. 14. Moreover, the microcomputer 80C runs and starts the sub control program in response to an interrupt issued at intervals of a time whose passage is indicated by the timer as described in the flowchart of FIG. 19.

When the sub control program is running, a voltage detected by the voltage sensor 50 and a current detected by the current sensor 40 are transferred as a battery voltage V and a buttery current I to the microcomputer 80C at step 800 in FIG. 19. Accordingly, at step 810, similarly to step 710 in FIG. 18, the index p of polarization is calculated based on the battery current I (A) according to the aforesaid expression (2).

At step 820, similarly to step 720 in FIG. 18, it is judged whether "index P of polarization≦predetermined index value Ps" is met. If the judgment of step 820 is made in the affirmative, it is judged at step 830 similarly to step 610 in FIG. 15 whether "battery current I≦predetermined current value Is" is met. If the judgment of step 840 is made in the affirmative, it is judged at step 850 that the battery B is fully charged.

Control is then passed to step 530 within the main control program in the same manner as it is described in relation to Embodiment a. Unlike Embodiment a, whether A, f the battery B is fully charged is judged from the judgment of step 850 (see FIG. 19). The other steps within the main control program are identical to those employed in Embodiment a.

As described previously, in Embodiment c, when it is found within the sub control program that the index P of polarization is equal to or smaller than the predetermined index value Ps, the battery current I is equal to or smaller than the predetermined current value Is, and the battery voltage V is equal to or larger than the predetermined voltage value Vs, it is judged that the battery B is fully charged. The fully-charged state of the battery B can therefore be judged highly precisely compared with when it is judged in accordance with Embodiment a or b. Using this method of judging whether a battery is fully charged, the remaining capacity SOC of the battery B can be calculated highly precisely all the time compared with when it is in accordance with Embodiment a or b. The other advantages are identical to those of Embodiment a.

Embodiment d

Figure 20:
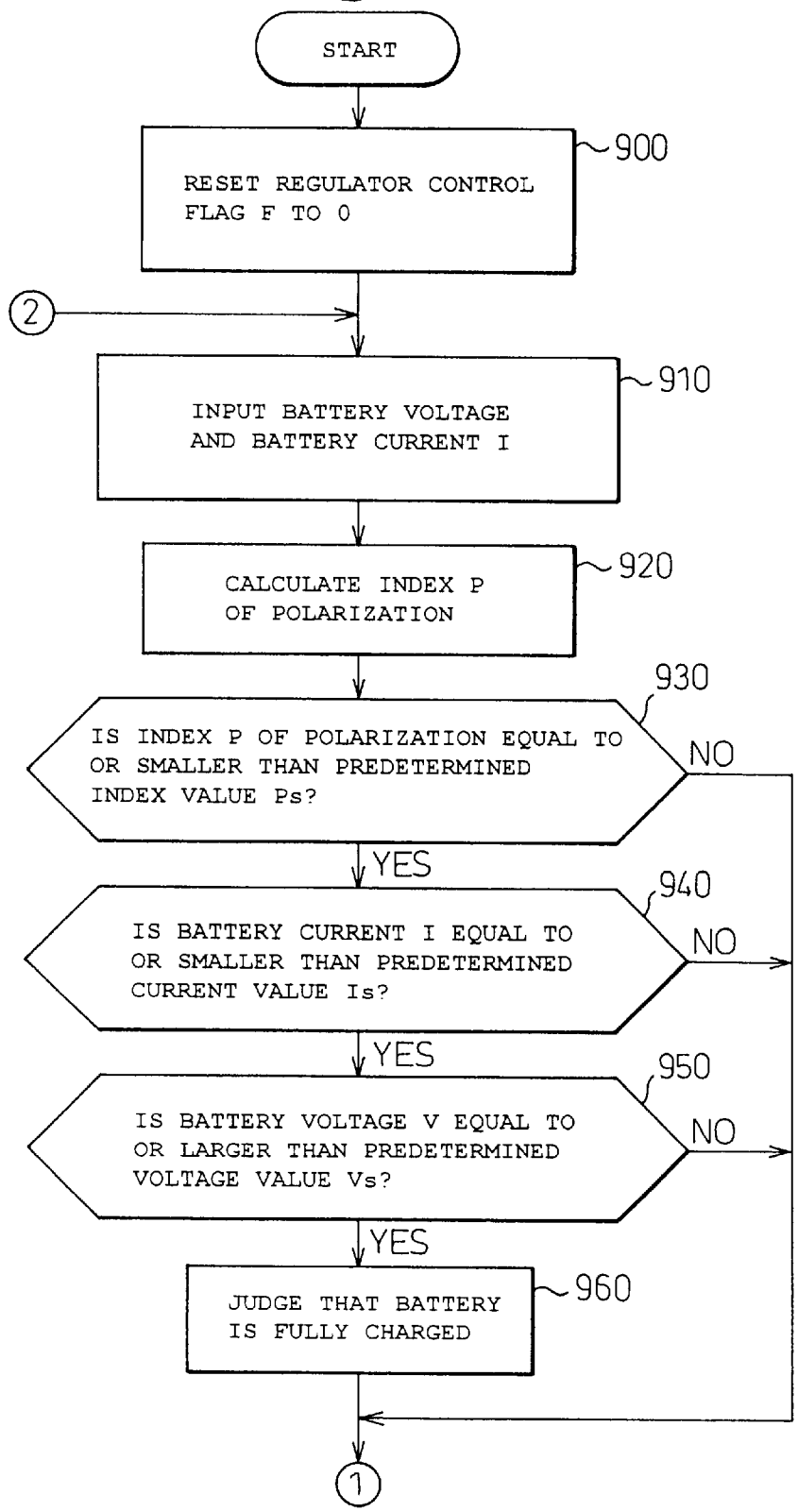
FIG. 20 is a first half of a flowchart describing a sub control program employed in Embodiment d, in which the, third mode of the present invention is implemented.
Figure 21:
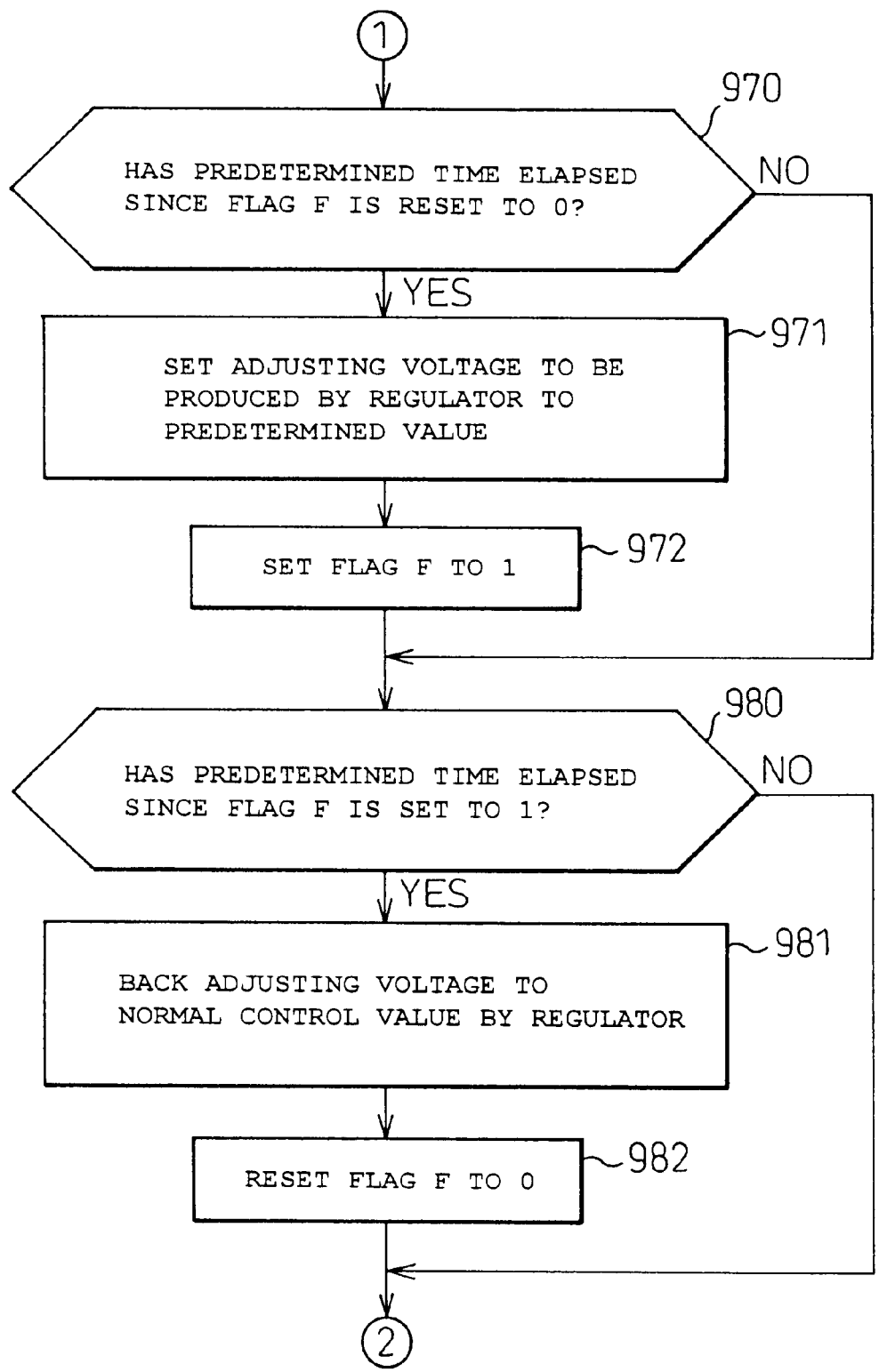
FIG. 21 is a second half of the flowchart describing the sub control program employed in Embodiment d described in FIG. 20.

Next, Embodiment d in which the third mode of the present invention is implemented will be described in conjunction with FIG. 20 and FIG. 21. For Embodiment d, the flowcharts of FIG. 20 and FIG. 21 are adopted on behalf of the flowchart of FIG. 19 described in relation to Embodiment c. In Embodiment d, the microcomputer 80C described in relation to Embodiment c runs the sub control program in response to an interrupt, which is issued at intervals of a time whose passage is indicated by the timer, as described in the flowcharts of FIG. 20 and FIG. 21 substituted for the flowchart of FIG. 19. However, the flowcharts of FIG. 20 and FIG. 21 are compiled by inserting steps 910 to 960 equivalent to steps 800 to 850 in FIG. 19 between step 900 and steps 970 to 982. The other components are identical to those described in relation to Embodiment c.

In Embodiment d having the foregoing components, when an automobile is driven, the microcomputer 80C runs and starts the main control program as described in the flowchart of FIG. 14. The microcomputer 80C runs and starts the sub control program in response to an interrupt, which is issued at intervals of a time whose passage is indicated by the timer, as described in the flowcharts of FIG. 20 and FIG. 21.

Within the sub control program, a regulator control flag F is reset to 0 at step 900 in FIG. 20. Thereafter, steps, 910 to 960 are performed in the same manner as steps 800 to 850 in FIG. 19. Immediately after step 900, the judgment of any of steps 930 to 950 is made in the negative.

At step 970 in FIG. 21, it is judged whether a predetermined time has elapsed since the flag F is reset to 0at step 900. If the predetermined time has not elapsed, the judgment of step 970 is made in the negative. Control is then passed to step 980. The judgment of step 980 is also made in the negative.

If the predetermined time has elapsed since the flag F is reset to 0 at step 900, the judgment of step 970 is made in the affirmative. At step 971, an adjusting voltage to be produced by the regulator 30 is set to a predetermined voltage value (higher than the adjusting voltage). Consequently, the regulator 30 regulates the adjusting voltage to the predetermined voltage value according to the setting performed by the microcomputer 80C.

When step 971 is performed as mentioned above, the regulator control flag F is set to 1 at step.972. Thereafter, at step 980, it is judged whether a predetermined time has elapsed since the flag F is set to 1. If the predetermined time has not elapsed, the judgment of step 980 is made in the negative. With the adjusting voltage to be produced by the regulator 30 set to the predetermined voltage value, steps 910 to 960 are executed in order to judge whether the battery is fully charged.

Thereafter, if the predetermined time has elapsed since the flag F is set to 1, the judgment of step 980 is made in the affirmative. At step 981, the adjusting voltage, to be produced by the regulator 30 is restored to a normal voltage value. Consequently, the regulator 30 regulates the adjusting voltage to the normal voltage value according to the restoration performed by the microcomputer 80C. At step 982 succeeding step 981, the flag F is reset to 0.

As described above, in Embodiment d, when it is found within the sub control program that the index P of polarization is equal to or smaller than the predetermined index value Ps, the battery current I is equal to or smaller than the predetermined current value Is, and the battery voltage V is equal to or larger than the predetermined voltage value, it is judged that the battery B is fully charged. Thus, the fully-charged state of the battery B can be judged highly precisely in the same manner as it is in Embodiment c.

In Embodiment d, while the sub control program is running, if the regulator control flag F is set to 1, that is, if the adjusting voltage to be produced by the regulator 30 is retained at the predetermined voltage value, whether the battery B is fully-charged is judged through steps 910 to 960. Consequently, when the adjusting voltage to be produced by the regulator 30 is set to the normal voltage value, whether the battery is fully charged cane be judged highly precisely while being unaffected by polarization. Using the method of judging whether a battery is fully charged, the remaining capacity SOC of the battery B can be calculated more highly precisely. The other advantages are identical to those of Embodiment a.

Embodiment e

Next, Embodiment e in which the third mode of the present invention is implemented will be described in conjunction with FIG. 22A to FIG. 28. Embodiment e has been proposed from the viewpoint described below. Calculation of the remaining capacity SOC of a battery is required to be precisely achieved as shortly as possible. In efforts to meet this requirement, it is possible to calculate the remaining capacity SOC by utilizing the open-circuit voltage of the battery (the voltage at the terminals of the battery attained when a nearly zero current flows through the battery).

Figure 23:
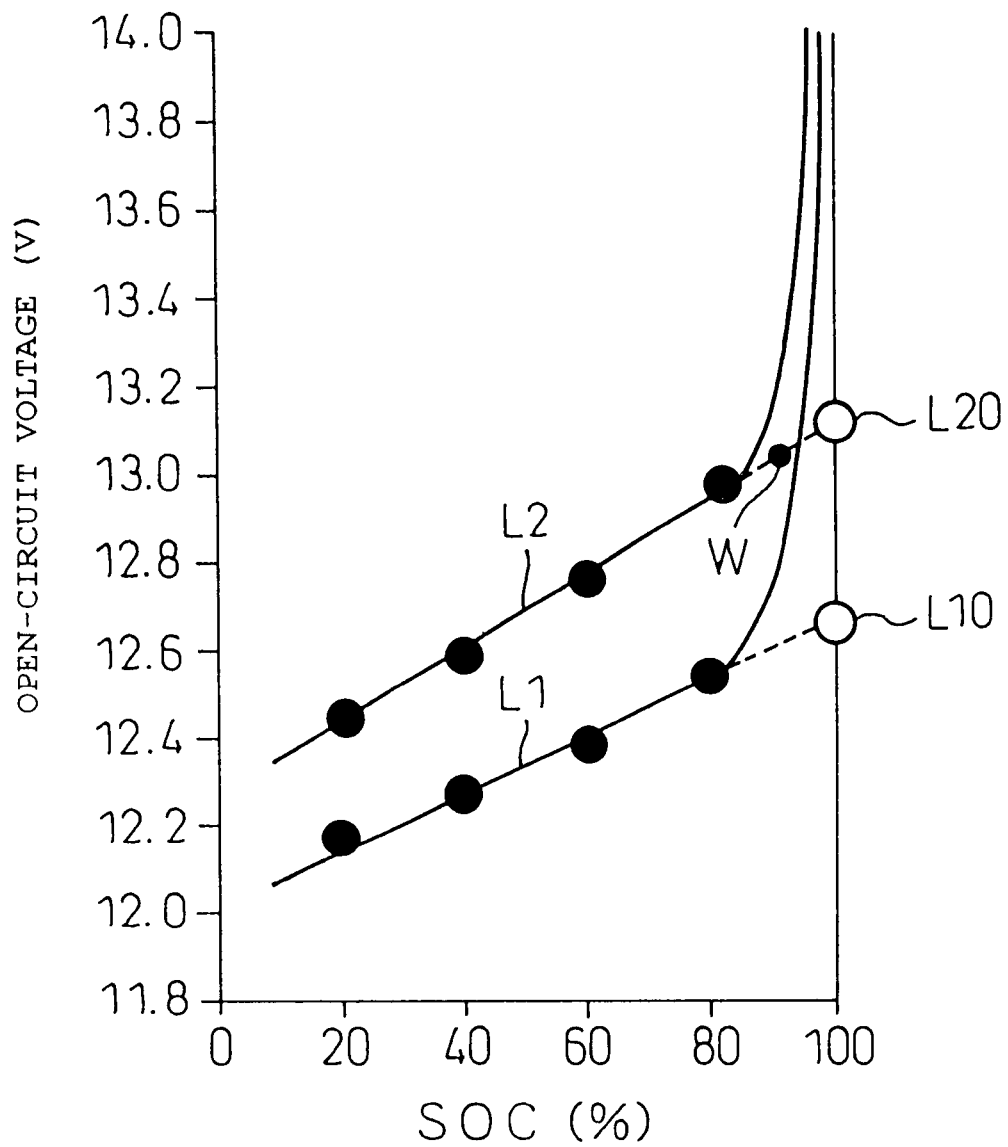
FIG. 23 is a graph showing the relationship between an open-circuit voltage of a battery and a remaining capacity SOC thereof that is established in Embodiment e when the battery has deteriorated or when the battery has not deteriorated at call.

The open-circuit voltage of the battery B described in relation to Embodiment b was discussed. This results in data shown ion FIG. 23. Referring to FIG. 23, a curve L1 indicates the relationship between the open-circuit voltage and remaining capacity SOC established in the initial stage of use of the battery B in which the battery B has not deteriorated. A curve L2 indicates the relationship between the open-circuit voltage and remaining capacity SOC established after the battery B has deteriorated because of use.

According to the curves L1 and L2, the open-circuit voltage of the battery B changes to relatively increase along with the progress of deterioration of the battery B irrespective of the remaining capacity SOC. When the open-circuit voltage changes with the progress of deterioration of the battery, the remaining capacity SOC cannot be calculated highly precisely by merely utilizing the open-circuit voltage.

Therefore, the expression (9) described in relation to Embodiment b was discussed. The aforesaid expression (9) is an experimental expression for calculating the distribution of the concentration values of electrolytic solution occurring near the electrodes of the battery as the index P of polarization by integrating the charging/discharge current values of the battery B.

In consideration of the index P of polarization provided by the experimental expression, the relationship between the terminal voltage of the battery B (battery voltage) and the current flowing through the battery B (battery current) was investigated. This results in data shown in FIG. 24a to FIG. 24c. FIG. 24a shows the relationship between the battery voltage and battery current of the battery B in a running automobile established as data unrelated to the index P. FIG. 24b shows the relationship between the battery voltage and battery current of the battery B established with the condition of index $|P|<1000$ met. FIG. 24c shows the relationship between the battery voltage and battery current of the battery B established with the condition of $|P|<100$ met.

The comparison among the data items shown in FIG. 24a to FIG. 24c. (see K in FIG. 24a to FIG. 24c) facilitates selection of data representing the relationship between the battery voltage and battery current of the battery B established originally. In other words, according to the expression (9), when the index P assumes a value near zero, the distribution of the concentration values of electrolytic solution in the battery B becomes uniform, and an accurate open-circuit voltage can be presumably detected.

From the above viewpoint, the relationship among the open-circuit voltage of the battery B, the index P, and the remaining capacity SOC was discussed. For example, FIG. 25a and FIG. 25b show the battery voltage and battery current as functions of time by a time instant when the battery B is fully charged by adopting a constant current constant voltage charging method.

Referring to FIG. 25a, a curve M1 indicates the battery voltage of the battery B that is a new battery, while a curve N1 indicates the battery voltage of the battery B that is a deteriorated battery. Referring to FIG. 25b, a curve M2 indicates the battery current of the new battery B, while a curve N1 indicates the battery current of the deteriorated battery B. Referring to the curves, when the battery voltage gets maximum and the battery current gets minimum (see points M20 and N20 in FIG. 25b), the new battery B and deteriorated battery B are judged to be fully charged.

Based on the data shown in FIG. 25a and 25b, a graph like the one shown in FIG. 16 was plotted as data shown in FIG. 26a in consideration of adaptation to an actual automobile. Referring to FIG. 26a, a point Q specified with coordinates is equivalent to the point M20 or N20 in FIG. 25b. The point Q in FIG. 26a corresponds to the point Q in FIG. 16, that is, a fully-charged state judgment point specified with the battery voltage of almost 14 V and the battery current of almost zero.

However, when it comes to adaptation of the present embodiment to an actual automobile, there is a problem. Namely, the distribution of points each specified with the battery voltage and battery current spreads widely. Therefore, the distribution of points specified with battery voltage values and battery current values detected when the remaining capacity SOC is 80% (see FIG. 26a) is hardly discriminated from the distribution of points specified with battery voltage values and battery current values detected when the remaining capacity SOC is 100% (see FIG. 26b).

In contrast, assume that points specified with battery voltage values and battery current values detected when the index P of polarization assumes an absolute value smaller than 2000, that is, when $|P|<2000$ are plotted. In this case, the distribution of points specified with battery, voltage values and battery current values detected when the remaining capacity SOC is 80% (see FIG. 27a) can be clearly discriminated from the distribution of points specified with battery voltage values and battery current values detected when the remaining capacity SOC is 100% (see FIG. 27b).

Figure 28:
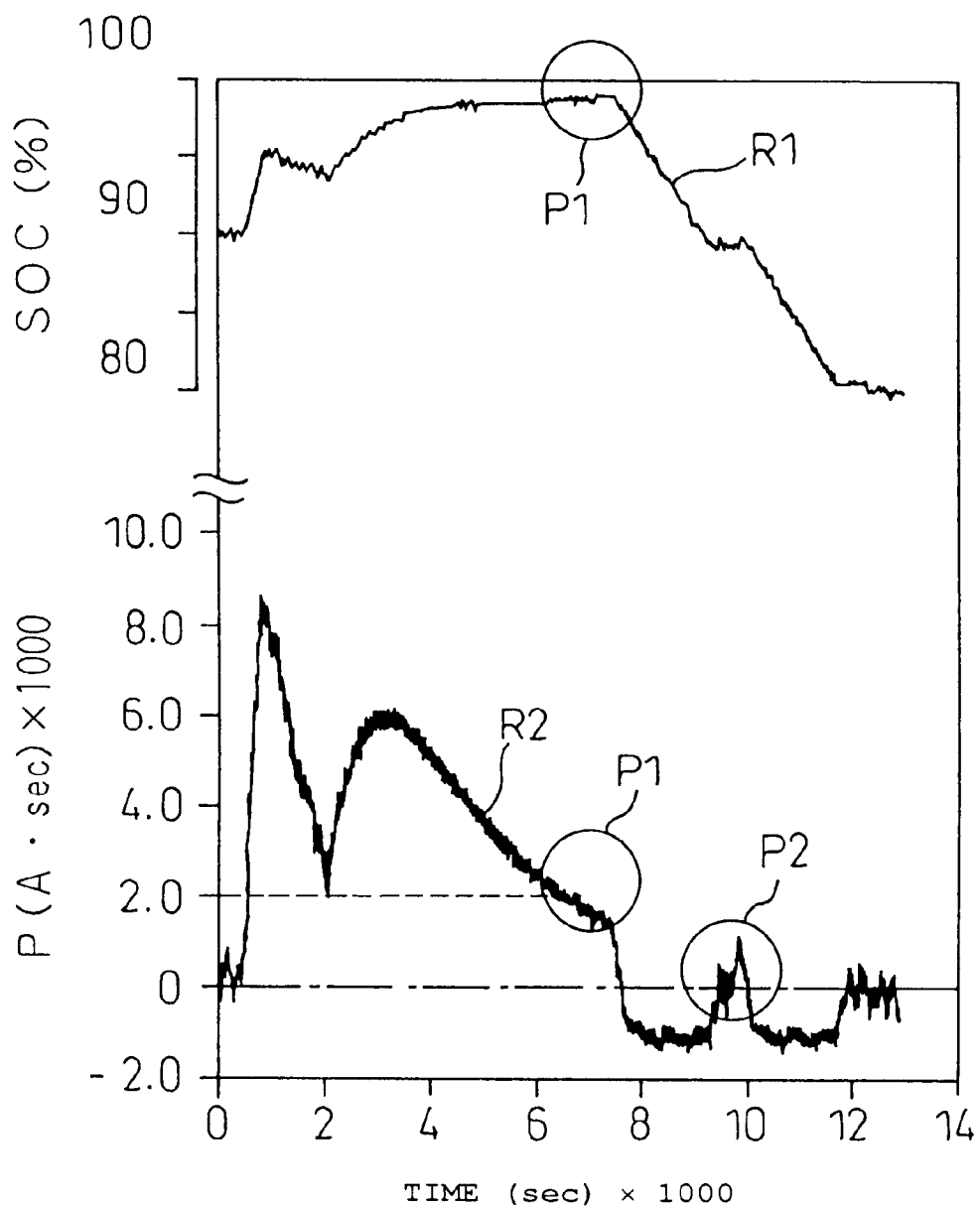
FIG. 28 is a graph indicating time-sequential changes in a remaining capacity SOC and in an index P occurring in an actual vehicle to which Embodiment e is adapted.

In consideration of the above fact, a change in the remaining capacity SOC and a change in the index P of polarization were investigated during running of an actual automobile. This results in data shown in FIG. 28. Referring to FIG. 28, a curve R1 represents the time-sequential change in the remaining capacity SOC of the battery B, while a curve R2 represents the time-sequential change in the index P of polarization of the battery B.

Referring to FIG. 28, parts P1 of the curves indicate the remaining capacity SOC and the index P(|P|<2000) attained when the battery B is almost fully charged. At this time, the battery current of the battery B is nearly zero and the open-circuit voltage thereof is as high as almost 14 V (see FIG. 23). After the battery B is thus fully charged, the battery is discharged freely in order to decrease the index P of polarization. When the index P assumes an absolute value smaller than 100 (|P|<100) as indicated by part P2 of the curve R2 in FIG. 28, polarization is satisfactorily canceled. In this state, an accurate open-circuit voltage can be detected as mentioned above.

The remaining capacity SOC attained in this state is calculated according to the following expression (10):

$$SOC=(Ah0-Qd)/(Ah0\cdot S)\cdot 100\% \qquad (10)$$

where Ah0 denotes the rated capacity for the battery B. Qd denotes an amount of discharge energy of the battery B accumulated from the instant the index P assumes a value P1 to the instant the index P assumes a value P2, and S denotes a temperature coefficient.

The open-circuit voltage of the battery B whose remaining capacity SOC assumes the value provided by the expression (10) is plotted as point W in the graph of FIG. 23. The point W is located on an extension of a straight part of the curve L2 which indicates the remaining capacity SOC of 80% or less. Moreover, the curve L2 is obtained by moving the curve L1 in parallel along the coordinate axis indicating the open-circuit voltage.

Consequently, the data representing the relationship between the open-circuit voltage and remaining capacity SOC established when the battery B has deteriorated is provided by extending a straight part of the curve L1 (see FIG. 23), which represents the initial characteristic of the battery B, as indicated with a dashed line, and then moving the straight part in parallel along the coordinate axis of the open-circuit voltage. In Embodiment e, the data representing the relationship between the open-circuit voltage and remaining capacity SOC established in the initial state of the battery B in which the battery B has not deteriorate (see the curve L1 in FIG. 23) is produced in advance. Based on the data, the remaining capacity SOC of the battery B is learned quickly and highly precisely in consideration of an amount of energy discharged after it is judged that the battery B is fully charged.

Figure 22A:
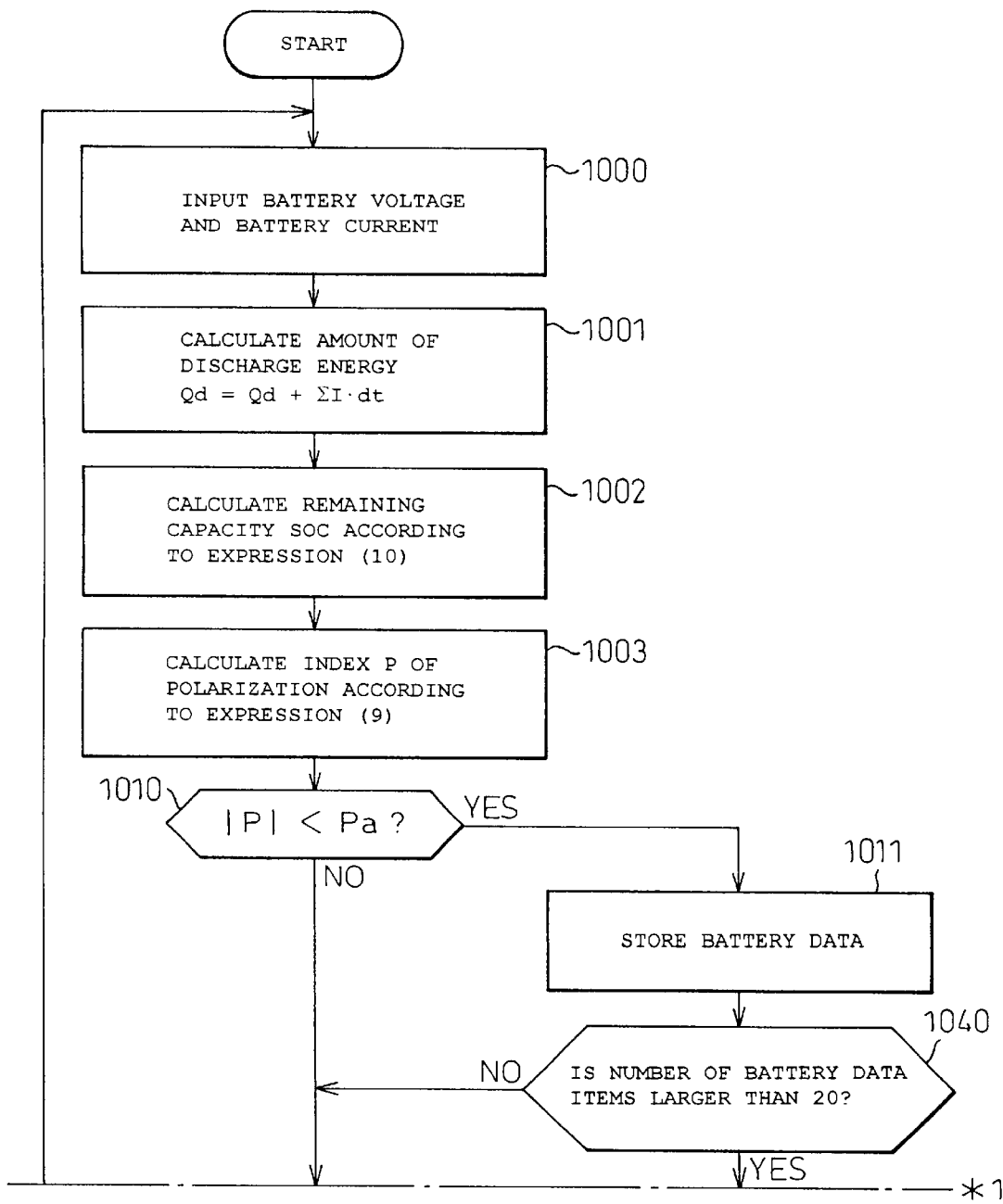

Consequently, in Embodiment e, the flowcharts of FIG. 22A and FIG. 22B are substituted for the flowcharts of FIG. 14 and FIG. 18 described in relation to Embodiment b. According to Embodiment e, the microcomputer 80C described in relation to Embodiment b runs a control program as described in the flowcharts of FIG. 22A and FIG. 22B substituted for the flowcharts of FIG. 14 and FIG. 18. The other components are identical to those of Embodiment b.

In, Embodiment e having the foregoing components, when an automobile is running, the control program is run to start as described in the flowcharts of FIG. 22A and FIG. 22B. At step 1000, a battery current I detected by the current sensor 40 and a battery voltage V detected by the voltage sensor 50 are received. At step 1001, an amount of discharge energy, Qd, is calculated according to the following expression (11):

$$Qd=Qd+\Sigma(I\cdot dt) \qquad (11)$$

Thereafter, at step 1002, the remaining capacity SOC of the battery B is calculated based on the calculated amount of discharge energy Qd according to the expression (10). At step 1003, the index P of polarization is calculated based on the battery current I according to the expression (9).

In this stage, if the absolute value of the index P is equal to or larger than a predetermined value, Pa=100, a judgment is made in the negative at step 1010. At step 1020, it is judged whether the running time of the automobile has exceeded a predetermined time (for example, 10 hours). The running time of an automobile is a time calculated as a multiple of one routine time (0.1 sec) that is required to complete a routine described in the flowchart of FIG. 22 and whose passage is indicated by a timer incorporated in the microcomputer 80. Moreover, the predetermined time of 10 hours is a time required for the battery B to deteriorate under the condition that the battery B is used during running of the automobile. The timer starts with activation of the microcomputer 80C interlocked with start of running of the automobile.

In this stage, the running time of the automobile falls below the predetermined time of 10 hours. If the battery is not fully charged, the judgment of step 1020 is made in the affirmative. A judgment is made in the negative at step 1030. The three conditions that should be met in order to judge at step 1030 that the battery is fully charged are such that the battery voltage V should be larger than 14 V, the battery current I should be smaller than 0 A, and the absolute value of the index P should be smaller than a value Pb=2000.

Thereafter, when the running time of the automobile becomes equal to or larger than the predetermined time of 10 hours, the judgment of step 1020 is made in the affirmative. At step 1021, the adjusting voltage to be produced by the regulator 30 is set to a predetermined value. At this time, when it is found at step 1000 that the latest battery voltage V and latest battery current I are 14 V or more and 0 A or less respectively, if it is found at step 1003 that the latest index value P falls below the value Pb=2000, the battery B is fully charged. The judgment of step 1030 is therefore made in the affirmative.

Consequently, at step 1031, the amount of discharge energy Qd is set to 0 and the adjusting voltage is set back to the original value. Consequently, the fully-charged state of the battery B is reset. At step 1032, a fully-charged state flag FG is set to 1. Thereafter, the discharge of the battery B is started with running of the automobile.

After the discharge of the battery B is started as mentioned above, the index P of polarization decreases. When the control program has progressed to its step 1010, if the judgment is made in the affirmative, the battery voltage V and battery current I are stored as battery data at step 1011. Thereafter, when the number of battery data items stored at step 1011 exceeds 20, a judgment is made in the affirmative at step 1040. At step 1041, the open-circuit voltage (hereinafter, the open-circuit voltage VB0) is calculated using the battery voltage values included in the 20 battery data items according to the method of least squares.

In this stage, the fully-charged state flag FG is set to 1 as mentioned above. A judgment is therefore made in the affirmative at step 1050. At step 1051, the data representing the relationship between the open-circuit voltage VB0 and the remaining capacity SOC (hereinafter VB0–vs.–SOC data) is learned as described below.

For the learning, the data having the straight part of the curve L1 in FIG. 23, which represents the relationship between the open-circuit voltage and remaining capacity SOC established in the initial stage of the battery B, extended as indicated with a dashed line in FIG. 23 (hereinafter, the initial open-circuit voltage-vs.-remaining capacity data) is stored in advance in the ROM in the microcomputer 80C. Incidentally, the open-circuit voltage associated with the remaining capacity, SOC=100% is indicated with point L10 on the initial open-circuit voltage-vs.-remaining capacity data in FIG. 23.

The degree of deterioration of the battery B varies depending on the amount of discharge energy released from the battery B. The data representing the relationship between the open-circuit voltage and remaining capacity shown as the curve L2 in FIG. 23 implies the variation of the degree of deterioration. As described above, the data is provided by moving the initial open-circuit voltage-vs.-remaining capacity data in parallel along the axis of open-circuit voltage. The open-circuit voltage associated with the remaining capacity SOC=100%, which is plotted on the extension of the straight part of the curve L2 indicated with the dashed line (L20 in FIG. 23), is comparable to the open-circuit voltage on the initial open-circuit voltage-vs.-remaining capacity data (L10 in FIG. 23).

In consideration of the above, a difference between the open-circuit voltage associated with the latest remaining capacity SOC (corresponding to the open-circuit voltage specified with the curve L20 in FIG. 23) and the open-circuit voltage plotted as the curve L10 that is provided as the initial open-circuit voltage-vs.-remaining capacity data is added to the open-circuit voltage specified with the curve L10. Thus, the open-circuit voltage VB0 that will be associated with the remaining capacity SOC=100% by referencing the open-circuit voltage-vs.-remaining capacity data that represents the relationship between the open-circuit voltage and remaining capacity established when the battery B has deteriorated is learned. This means that the VB0-vs.-SOC data has been learned.

After the step 1051 is completed, the fully-charged state flag FG is reset to 0 at step 1052. Thereafter, when the control program progresses to its step 1050, since the flag FG is reset at step 1052, the judgment is made in the negative. At step 1053, the remaining capacity SOC is calculated by referencing the VB0-vs.-SOC data learned at step 1051 using the open-circuit voltage VBO,calculated at step 1041. In, this case, the learning of step 1051 is dependent on the degree of deterioration of the battery B, that is, the amount of discharge energy. The remaining capacity SOC calculated at step 1053 is therefore dependent on the degree of deterioration of the battery B.

As described above, in Embodiment e, after it is judged that the battery B is fully charged, it is judged at step 1010 whether the absolute value of the index P has decreased to fall below the value Pa. The VB0-vs.-SOC data specifying the open-circuit voltage observed when the battery B has deteriorated is learned as described above. By referencing the learned data, the remaining capacity SOC observed when the battery B has deteriorated is calculated. In other words, even when the battery B deteriorates, the remaining capacity SOC is calculated by referencing the VB0-vs.-SOC data learned when the concentration of electrolytic solution in the battery B becomes uniform, that is, when the effect of polarization indicated with the index P on the electrolytic solution is canceled. Consequently, the remaining capacity SOC of the battery B can be calculated quickly and highly precisely while being unaffected by the degree of deterioration of the battery B.

In the embodiments of the present invention, the battery B is not limited to a lead acid battery, but may be any kind of secondary battery. Moreover, the number of batteries constituting the battery B may be modified, if necessary.

Moreover in the embodiments of the present invention, the remaining capacity SOC may not be stored and preserved in a memory incorporated in the microcomputer, but may be stored and preserved in a nonvolatile memory immediately before every execution of step 570 (280). This obviates the necessity of straight connection between the battery B and microcomputer.

Moreover, in the embodiments of the present invention, the criteria defined for steps 1010, 1020, and 1030 described in relation to Embodiment e may be modified if necessary.

In the embodiments of the present invention, the steps described in the flowcharts may be achieved by hardware logic circuits serving as feature executing means.

Industrial Applicability

As described so far, according to the present invention, there is provided a battery capacity measuring and remaining capacity calculating system. More particularly, there are provided a battery capacity measuring device for vehicle batteries, a remaining capacity calculating system for vehicle batteries, an automatic engine stopping/starting system based on a remaining battery capacity, an electrical rotating machine control system based the remaining battery capacity, and a battery fully-charged state judging system for vehicle batteries. Whether a battery is fully charged can be measured or judged highly precisely. The industrial applicability of the present invention is therefore immeasurable.

What is claimed is:

1. A battery capacity measuring device, attached to a battery rechargeable by a generator, for measuring the present capacity of a battery according to an integrated value of charging/discharge current values of the battery detected by a current sensor, said battery capacity measuring device comprising:

a fully-charged state judging means for detecting that a battery is fully charged;

a detected current integrating means for integrating current values that are detected by said current sensor during a period from the instant the battery is fully charged to the instant it is fully charged later;

a dividing means for dividing the integrated value of detected current values calculated by said detected current integrating means by the length of the period; and a correcting means for correcting a detected current using the quotient provided by said dividing means as an offset.

2. A battery capacity measuring device according to claim 1, further comprising a fully charging means that, when a predetermined time has elapsed since the instant the battery is fully charged previously, controls said generator so as to fully charge the battery.

3. A remaining capacity calculating system for vehicle batteries, comprising:

a voltage detecting means for detecting the voltage at the terminals of a battery that is mounted in a vehicle having an electrical rotating machine connected to an engine and that is charged by the electrical rotating machine;

a current detecting means for detecting a current that flows through the battery;

an index calculating means for calculating an index of polarization in the battery according to the detected current;

a control means for controlling the electrical rotating machine so that the index of polarization will remain within a predetermined range which permits limitation of the effect of polarization on the charged state of the battery; and a calculating means for when the index of polarization remains within the predetermined range, calculating the remaining capacity of the battery according to the detected terminal voltage of the open-circuit voltage of the battery.

4. An automatic engine stopping/starting system for vehicles comprising the remaining capacity calculating system for vehicle batteries set forth in claim 3, and an inhibiting means (230) for, when the remaining capacity of the battery falls below a permissible value, inhibiting automatic stopping of an engine.

5. An electrical rotating machine control system for vehicles comprising the remaining capacity calculating system for vehicle batteries set forth in claim 3, and a control means for, when the remaining capacity is equal to or larger than a permissible value, controlling a motor-generator, which serves as the electrical rotating machine, so that the motor-generator will assist the engine.

6. An electrical rotating machine control system for vehicles comprising:

a voltage detecting means for detecting the voltage at the terminals of a battery that is mounted in a vehicle having an electrical rotating machine connected to an engine and that is charged by the electrical rotating machine;

a current detecting means for detecting a current that flows through the battery;

an index calculating means for calculating an index of polarization in the battery according to the detected current; and a control means for controlling the electrical rotating machine so that the index of polarization will remain within a predetermined range which permits limitation of the effect of polarization on the charged state of the battery.

7. A fully-charged state judging system for vehicle batteries, comprising:

a voltage detecting means for detecting the voltage at the terminals of a battery that is mounted in a vehicle having an alternator and a regulator for regulating the output voltage of said alternator, and that is charged with the output voltage of said alternator regulated by said regulator;

a current detecting means for detecting a current that flows through the battery;

a fully-charged state judging means for, when the detected terminal voltage of the battery and the detected current belong to a predetermined fully-charged state judgment range, judging that the battery is fully charged;

and an index calculating means for calculating an index of polarization in the battery according to the detected current, wherein said fully-charged state judging means judges whether the battery is fully charged by checking if the index of polarization falls within a predetermined range of index values.

8. A fully-charged state judging system for vehicle batteries according to claim 7, wherein the predetermined fully-charged state judgment range is a range specified with voltage values that are higher than the rated voltage for the battery with the battery charged 90% or more, and with current values assumed by a zero current flowing through the battery or a discharge current of the battery.

9. A fully-charged state judging system for vehicle batteries according to claim 8, wherein the predetermined range of index values is a range of index values permitting negligence of a change in the concentration of electrolytic solution in the battery.

10. A fully-charged state judging system for vehicle batteries, comprising:

a voltage detecting means for detecting the voltage at the terminals of the battery that is mounted in a vehicle having an alternator and a regulator for regulating the output voltage of said alternator, and that is charged with the output voltage of said alternator regulated by said regulator;

a current detecting means for detecting a current that flows through the battery;

an index calculating means for calculating an index of polarization from the electrolytic solution in the battery according to the detected current; and a fully-charged state judging means for, when the detected terminal voltage of the battery belongs to a predetermined fully-charged state judgment range and the index of polarization belongs to a predetermined range of index values, judging that the battery is fully charged.

11. A fully-charged state judging system for vehicle batteries according to claim 10, wherein:

the predetermined fully charged-state judgment range is a range specified with voltage values that are higher than the rated voltage for the battery with the battery charged 90% or more; and the predetermined range of index values is a range of index values permitting negligence of a change in the concentration of electrolytic solution in the battery.

12. A fully-charged state judging system for vehicle batteries according to claim 7, further comprising a regulator control means for controlling said regulator so that an adjusting voltage to be produced by said regulator will be set to a predetermined voltage value higher than a normal voltage value repeatedly at regular intervals, wherein:

said fully-charged state judging means makes a judgment when the adjusting voltage to be produced by said regulator assumes the predetermined voltage value.

13. A remaining capacity calculating system for vehicle batteries comprising the fully-charged state judging system for vehicle batteries set forth in claim 7, and a remaining capacity calculating means for, when a fully-charged state judging means included in said fully-charged state judging system judges that the battery is fully charged, calculating the remaining capacity of the battery.

14. A remaining capacity calculating system for vehicle batteries having the fully-charged state judging system for vehicle batteries set forth in claim 8, said remaining capacity calculating system for vehicle batteries comprising:

an index judging means for after a fully-charged state judging means included in said fully-charged state judging system judges that the battery is fully charged, judging whether the index of polarization falls within a range of values permitting stabilization of the open-circuit voltage of the battery;

a learning means for when said index judging means judges that the index of polarization falls within the range of values permitting stabilization of the open-circuit voltage of the battery, learning the relationship between the remaining capacity and open-circuit voltage established based on the degree of deterioration of the battery; and a remaining capacity calculating means for calculating the remaining capacity of the battery by referencing the result of learning, which is provided by said learning means, according to the open-circuit voltage of the battery.

15. A remaining capacity calculating system for vehicle batteries according to claim 14, wherein after it is judged that the battery is fully charged, said learning means performs the learning according to an amount of discharge energy of the battery by referencing the relationship between the remaining capacity and open-circuit voltage established in the initial stage of the battery until said index judging means judges that the index of polarization falls within the range of values permitting stabilization of the open-circuit voltage of the battery after it is judged that the battery is fully charged.

* * * * *